United States Patent [19]

Takahashi et al.

[11] Patent Number: 5,719,815
[45] Date of Patent: Feb. 17, 1998

[54] SEMICONDUCTOR MEMORY HAVING A REFRESH OPERATION CYCLE AND OPERATING AT A HIGH SPEED AND REDUCED POWER CONSUMPTION IN A NORMAL OPERATION CYCLE

[75] Inventors: Yasushi Takahashi, Tachikawa; Takashi Shinoda; Masamichi Ishihara, both of Hamura-machi; Tetsu Udagawa, Iruma; Kazumasa Yanagisawa, Kokubunji, all of Japan

[73] Assignee: Hitachi, Ltd., Tokyo, Japan

[21] Appl. No.: 503,738

[22] Filed: Jul. 18, 1995

Related U.S. Application Data

[63] Continuation of Ser. No. 198,631, Feb. 18, 1994, abandoned, which is a continuation of Ser. No. 999,689, Dec. 31, 1992, abandoned, which is a continuation of Ser. No. 715,863, Jun. 17, 1991, abandoned, which is a continuation of Ser. No. 349,844, May 10, 1989, abandoned.

[30] Foreign Application Priority Data

May 13, 1988 [JP] Japan .................. 63-116284
Jul. 5, 1988 [JP] Japan .................. 63-167574

[51] Int. Cl.⁶ .................................................. G11C 7/00
[52] U.S. Cl. .................. 365/222; 365/149; 365/63; 365/51
[58] Field of Search ............. 365/222, 230.03, 365/149, 51, 63

[56] References Cited

U.S. PATENT DOCUMENTS

| | | | |
|---|---|---|---|
| 3,940,747 | 2/1976 | Kuo et al. | 365/222 |
| 3,964,030 | 6/1976 | Koo | 365/222 |
| 4,486,860 | 12/1984 | Takemae et al. | 365/230.03 |
| 4,542,486 | 9/1985 | Anami et al. | 365/230.03 |
| 4,554,646 | 11/1985 | Yoshimoto et al. | 365/230.03 |
| 4,555,778 | 11/1985 | Sakurai | 365/230.03 |
| 4,596,003 | 6/1986 | Shimizu | 365/230.03 |
| 4,677,592 | 6/1987 | Sakurai et al. | 365/222 |
| 4,747,082 | 5/1988 | Minato et al. | 365/222 |
| 4,758,993 | 7/1988 | Takemae | 365/222 |
| 4,777,625 | 10/1988 | Sakai et al. | 365/207 |
| 4,791,613 | 12/1988 | Hardee | 365/190 X |
| 4,794,567 | 12/1988 | Akatsuka | 365/190 |
| 4,802,135 | 1/1989 | Shinoda et al. | 365/230.03 |
| 4,819,207 | 4/1989 | Sakui et al. | 365/222 |
| 4,825,413 | 4/1989 | Tran | 365/190 |
| 4,931,994 | 6/1990 | Matsui et al. | 365/230.03 |
| 4,933,907 | 6/1990 | Komanoya et al. | 365/230.03 |
| 4,941,129 | 7/1990 | Oshima et al. | 365/230.03 |
| 4,956,811 | 9/1990 | Kajigaya et al. | 365/51 |

FOREIGN PATENT DOCUMENTS

| | | |
|---|---|---|
| 57-203290 | 12/1982 | Japan . |
| 58-139392 | 8/1983 | Japan . |
| 59-72699 | 4/1984 | Japan . |
| 62-20197 | 1/1987 | Japan . |
| 62-241198 | 10/1987 | Japan . |
| 62-291792 | 12/1987 | Japan . |
| 63-53786 | 3/1988 | Japan . |

*Primary Examiner*—Joseph A. Popek
*Attorney, Agent, or Firm*—Antonelli, Terry, Stout, & Kraus, LLP

[57] ABSTRACT

An ordinary read/write operation (normal operation) and a refresh operation are separated from one another and the number of read amplification circuits or, in other words, the number of sense amplifiers operating during the normal operation is made smaller than that during the refresh operation. Accordingly, a bit line charge/discharge current during the normal operation can be reduced.

37 Claims, 13 Drawing Sheets

REFRESH CYCLE

SEMICONDUCTOR MEMORY HAVING A REFRESH OPERATION CYCLE AND OPERATING AT A HIGH SPEED AND REDUCED POWER CONSUMPTION IN A NORMAL OPERATION CYCLE

This application is a continuation of application Ser. No. 08/198,631, filed Feb. 18, 1994 now abandoned; which is a continuation of application Ser. No. 07/999,689, filed Dec. 31, 1992, now abandoned; which is a continuation of application Ser. No. 07/715,863, filed Jun. 17, 1991, now abandoned; and which, in turn, is a continuation of application Ser. No. 07/349,844, filed May 10, 1989, now abandoned.

BACKGROUND OF THE INVENTION

This invention relates to a semiconductor memory technique and further to a technique particularly useful when applied to a driving system of a read amplification circuit and to a technique useful when applied to a dynamic type RAM (Random Access Memory) requiring a refresh operation, for example.

In a dynamic RAM consisting of charge storage type memory cells, a periodic refresh operation is necessary in order to prevent loss of information resulting from a leakage of the information charge stored in capacitors.

A conventional dynamic RAM incorporates, generally, a refresh controller and selects simultaneously one or several rows of a memory array in accordance with the structure of a memory mat to effect the refresh operation.

A standard 4-mega bit RAM is designed so as to provide a operation refresh 10 to 24 times per 16 ms. Therefore, the number of memory cells to be selected at a time is 4,096 bits. In the DRAM of the type in which the number of memory cells connected to one word line is 1,024 bits, therefore, four word lines are selected simultaneously and in the DRAM in which the number of memory cells on one word line is 2,048 bits, two word lines are selected simultaneously, at the time of refresh.

Such a DRAM is described in Japanese Patent Application No. 195322/1986, for example published as Japanese Patent Application Laid-open No. 63-53786.

Each refresh operation is conducted for read and write or, in other words, in order to read out the information of a memory cell and write again the same information. Therefore, in order to refresh the memory cells of 4,096 bits at a time as described above, at least 4,096 sense amplifiers (read amplification circuits) are necessary.

The conventional dynamic RAM has a construction wherein the number of sense amplifiers which are required during a refresh cycle (4,096 in the 4-M bits DRAM) correspond to the number which are driven simultaneously at the time of ordinary data read-out, too, and desired data is selected from the data read out to the sense amplifiers by a column address, and then amplified and outputted by a main amplifier.

In such a system where all the sense amplifiers determined by the refresh cycle are simultaneously driven, there has been the problem of extremely large power consumption as a resulting of the charging and discharging of bit lines with the operations of the sense amplifiers.

SUMMARY OF THE INVENTION

It is a main object of the present invention to reduce consumed power in a dynamic RAM requiring a refresh operation.

Among the inventive features disclosed herein for accomplishing the first object described above, the following will illustrate a typical example.

Each word line inside a memory array is finely divided so as to reduce the number of memory cells connected to each word line, and one of the finely divided word lines is selected during a read/write operation so as to operate only the sense amplifier on the bit line belonging to the selected word line and a plurality of word lines are selected simultaneously during a refresh operation so as to operate all the sense amplifiers.

The word line is disposed of double (two) word lines wherein, one of the word lines which is connected directly to the memory cell is finely divided an, into two sub-word lines resulting sub-word lines are connected to the other one of the double word lines, or main word line, through switch means, respectively, so that all the sub-word lines corresponding to the same main word line are connected to the main word line thereof during the refresh operation and only one sub-word line is connected to the main word line during the read/write operation.

In other words, the read/write operation (normal operation) and the refresh operation are separated from one another and the number of read amplification circuits or, in other words, the number of sense amplifiers/operating during the normal operation is made smaller than the number during the refresh operation.

Accordingly, since the bit line charge/discharge current can be reduced during the normal operation power consumption by DRAM associated with having such designing features can be reduced drastically.

Since the number of sense amplifiers selected simultaneously during the normal operation is reduced, charge/discharge of the bit line can be conducted at a high speed and the of the DRAM can be improved.

It is a second object of the present invention to provide a semiconductor memory device which improves the read operation speed and reduces power consumption.

Among the improvements and movie features disclosed herein for accomplishing this second object, the following will illustrate a typical invention. In a semiconductor memory device such as a dynamic RAM, common data lines for writing and common data lines for reading are disposed separately from one another and, the read common data line is connected indirectly to each data line of a memory array through a switch MOSFET which is disposed in series between the read common data line and a ground potential of a circuit and is turned ON selectively in accordance with a column address signal and through an amplification MOSFET whose gate is connected to the corresponding data line of the memory array, and its signal amplitude is limited to the minimum necessary value.

According to the means described above, the read operation speed of the dynamic type RAM can be improved and the power consumption required for the read operation of the dynamic type RAM can be reduced by reducing the driving capacity required for each unit amplification circuit of the sense amplifier.

The above and other objects, novel features and advantages of the present invention will become more apparent from the following detailed description when taken in conjunction with the accompanying drawings.

DESCRIPTION OF THE PREFERRED EMBODIMENTS

[Embodiment for Accomplishing the First Object of this Invention]

Figure 1:
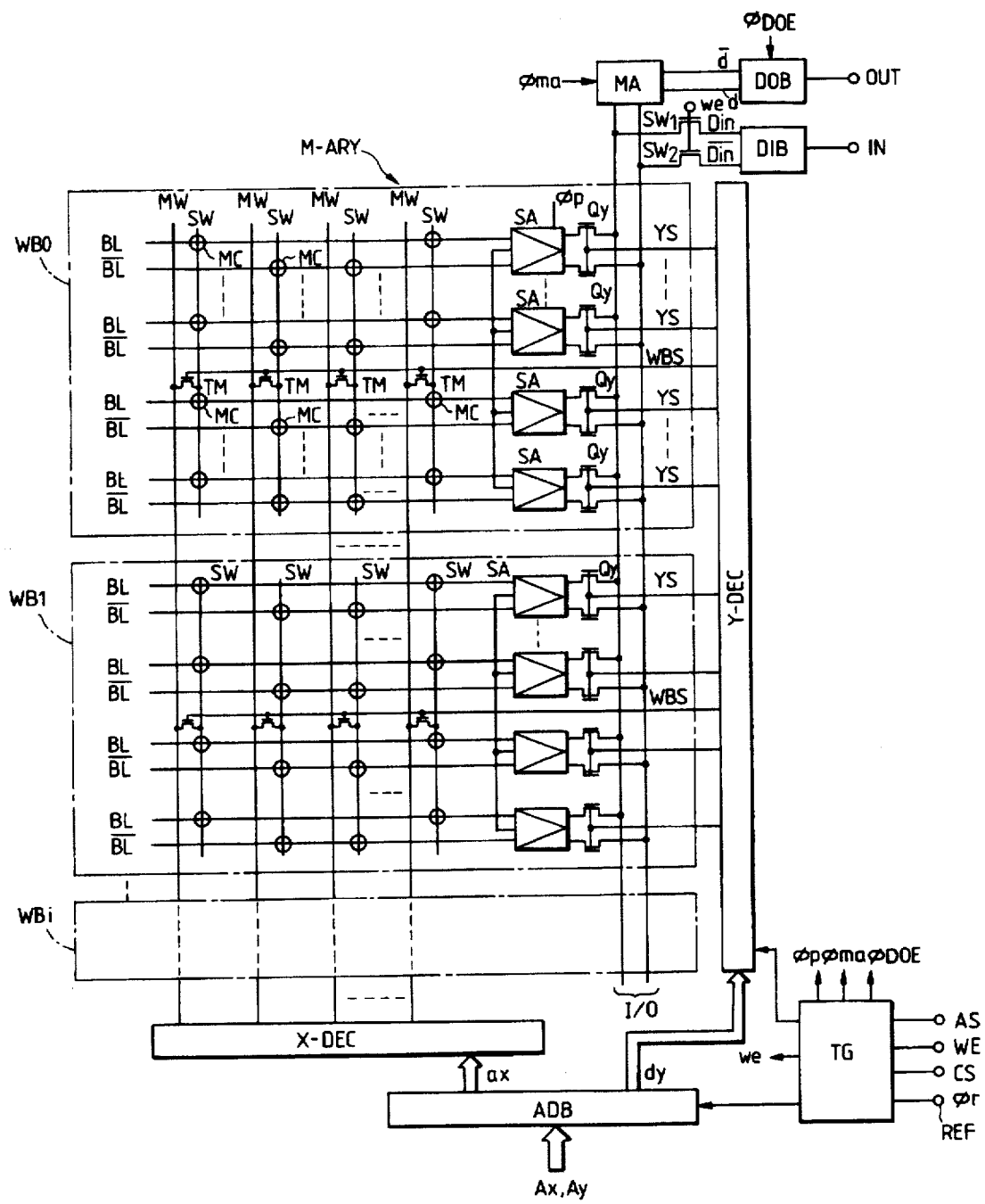
FIG. 1 is a circuit structural view showing an embodiment of dynamic RAM in accordance with the present invention.

FIG. 1 shows an embodiment of dynamic RAM to which the present invention is applied.

In the drawing, symbol M-ARY represents a memory array consisting of a plurality of memory cells arranged in matrix. Symbol ADB represents an address buffer; X-DEC is an X decoder for selecting one word line W in the memory array M-ARY; and Y-DEC is a Y decoder which selects a pair of bit lines BL and $\overline{BL}$ in the memory array and generates a selection signal YS for effecting ON/OFF control of a pair of column switches $Q_y$ for connecting the sense amplifier SA, which is connected to the bit line pair, to common input/output signal lines I/O.

In FIG. 1, circles o on the bit lines BL, $\overline{BL}$ represent the memory cells and each memory cell MC consists of a MOSFET switch for selection and a capacitor for storing an information charge.

The amplification signal of the sense amplifier SA is sent to a main amplifier MA through the common input/output signal line I/O and the output of the sense amplifier SA is further amplified by the main amplifier MA and supplied as differential outputs d, $\overline{d}$ to an output buffer DOB.

An input buffer DIB is connected to an input terminal IN, and complementary write data signals Din, $\overline{Din}$ generated by the input buffer DIB are put onto the common input/output signal lines I/O through write control switches $SW_1$, $SW_2$ and are written into the memory cells that are selected at that time, through the bit lines BL, $\overline{BL}$.

Each sense amplifier SA is equipped with a circuit for precharging the bit lines BL, $\overline{BL}$ to $V_{cc}/2$ so as to precharge these bit lines BL, $\overline{BL}$ to $V_{cc}/2$ when the word line is selected. At this time the common source line of the sense amplifier SA, too, is precharged to $V_{cc}/2$.

Disposed in the memory chip is a timing generation circuit TG which generates a precharge signal $\phi p$, control signals we for the write control switches $SW_1$, $SW_2$ described above, output control signals $\phi_{DOE}$ supplied to the output buffer, control signals $\phi_{ma}$ for providing the operation timing of the main amplifier MA, and the like, on the basis of an address strobe signal AS, a write control signal WE, a chip selection signal CS, and the like supplied from outside.

The timing generation circuit TG has a register for holding a refresh address. When a signal representing the refresh timing is supplied from outside, the refresh address is incremented and its refresh address is supplied to the X decoder X-DEC so as to execute refresh.

The construction described above is substantially the same as that of the conventional dynamic RAM. In this embodiment, however, the memory array M-ARY is divided into a plurality of word blocks WB0, WB1, . . . , WBi in the word direction and sub-word lines SW are disposed as mutually separated memory gates (a line connecting the gate electrode of the selection MOS of each memory cell) for each of the divided word blocks. In the dynamic RAM which uses aluminum two-layer wiring technique, the resistance of the word line can be reduced by wiring an aluminum layer on the memory gates as the word lines consisting of a polysilicon layer, disposing contact portions between these wirings with a suitable pitch and connecting them together. If such a two-layer wiring technique is employed, the wiring construction such as described above can be accomplished by merely cutting the memory gate consisting of the polysilicon layer for each word block.

A transfer MOS switch TM is disposed for each of the sub-word lines thus divided so that the sub-word line can be connected to a common main word line MW disposed in such a manner as to bridge each word block.

This transfer MOS TM is turned ON by the block selection signal WBS outputted from the Y decoder Y-DEC simultaneously when any of the bit lines inside each word block is selected.

In the conventional dynamic RAM, however, the bit line may be selected after the level of the bit line is determined by the sense amplifier SA. Therefore, a column selection signal YS is generated on the basis of the column address which is received later by an address multiplex system but in the system of the present invention which selects the word blocks WB on the basis of the Y system address signal $A_y$, the block selection signal WBS must be outputted substantially simultaneously with the rise of the level of the word line.

Accordingly, the dynamic RAM of this embodiment employs an address non-multiplex system and is equipped with address input pins of a number corresponding to that capable of simultaneously inputting all the address signals $A_x$ and $A_y$ of both X and Y systems. On the other hand, one kind of address strobe signal AS can be inputted as the signal providing the timing of inputting these address signals. An input pin REF of a refresh clock $\phi r$ is also disposed in order to provide the refresh timing from outside.

When the refresh clock $\phi r$ is inputted, the timing generation circuit TG gives the refresh address corresponding only to the X system to the X decoder X-DEC through the address buffer ADB and sets one word line to the selection level. At the same time it gives a control signal, which sets all the block selection signals WBS to the selection level, to the Y decoder Y-DEC. The block selection signals WBS from the Y decoder Y-DEC are supplied commonly to the sense amplifiers SA in the corresponding blocks so that all the sense amplifiers SA in the memory array are driven simultaneously and refresh is executed.

The selection level of the block selection signal WBS and the word line selection signal, which is applied to the selected main word line MW from the X decoder X-DEC, is boosted to the level which is by 2 to 3 V higher than $V_{CC}$ so that a voltage of a sufficient level can be applied to the memory cell.

On the other hand, when the selection signal of the bit line corresponding to the column address $A_Y$ is outputted from the Y decoder at the time of ordinary read and write, only the block selection signal WBS for the word block to which this bit line belongs is set to the selection level. Therefore, only the sense amplifier SA belonging to one block among i word blocks is driven by the precharge signal φp from the timing generation circuit TG and the corresponding bit lines BL, $\overline{BL}$ are precharged and connected to the precharged common source line.

Accordingly, if the number of memory cells belonging to one sub-word line is from 50 to 100 in the embodiment described above, the number of sense amplifiers driven at the time of read and write is from 1/40 to 1/80 of 4,096 at the time of refresh in the case of 4-M bits DRAM. Moreover, since the refresh cycle itself is considerably longer than the read and write cycle, the power consumed by the memory as a whole can be reduced by about 40% in comparison with the dynamic RAM of the conventional system.

Furthermore, in the dynamic RAM to which the aluminum two-layered wiring is applied, if the word line consisting of the second layer (upper layer) aluminum wiring is superposed on the memory gate (sub-word line) consisting of the polysilicon layer so as to reduce the resistance, areas referred to as "shunt portions" are often disposed inside the memory array in order to short-circuit the aluminum word line to the memory gate through the first layer (lower layer) aluminum layer. This shunt portion is the area where no memory cell is disposed. If, in this case, the transfer MOS TM for selecting the word blocks described above is disposed in the shunt portion and connection to the main word line MW and the sub-word line SW is made-by use of the first layer aluminum layer, the increase in the occupying area of the memory array resulting from the addition of this transfer MOS TM can be minimized.

When the aluminum two-layer wiring is adopted as described above, the block selection signal line (WBS) may be formed by the same first layer aluminum layer as the bit line in parallel with it.

In the embodiment described above, the word line inside the memory array is finely divided, i.e. it is subdivided into discrete sub-word lines, so as to decrease the number of memory cells connected to one word line i.e. the main word line thereof, one of the divided word or sub-word lines is selected at the time of read and write so as to operate only the sense amplifiers on the data line belonging to the selected word line, i.e. the selected sub-word line in conjunction with the selected main word line correspondingly associated therewith and a plurality of word lines are simultaneously selected at the time of refresh. Accordingly, though the number of sense amplifiers driven at the time of refresh remains unchanged in the same way as in the conventional system, the number of them driven at the time of read and write becomes smaller in accordance with an inverse proportion to the factor used for dividing the word line into the sub-word lines. Moreover, since the refresh cycle is 1,024 times per 16 ms and is considerably longer than the read and write cycle, the time of the memory cell operation in which a large number of sense amplifiers are driven simultaneously is extremely short. Since the number of bit lines charged and discharged by the sense amplifiers at the time of read and write can thus be reduced drastically, the consumed power of the dynamic RAM can be reduced.

The embodiment uses the structure of double (two) word lines for each word line address selection made by the X decoder X-DEC wherein the one of the word lines which is connected directly to the memory cells is finely divided (or sub-divided) into a number of sub-word lines, the sub-word lines are controllably connected to the other one of the word lines or main word line which is correspondingly associated therewith through the respective switch means. As a result therefore all the sub-word lines corresponding to the same main word line are connected to the main word line at the time of refresh and only one sub-word line is selectively connected to the main word line at the time of read and write. Accordingly, the embodiment can form the dynamic RAM exhibiting the desired operation by merely changing the mask without adding a new process.

Though the present invention has thus been described definitely with reference to one preferred embodiment thereof, it is not particularly limited thereto but can of course be changed or modified in various manners without departing from the gist thereof. For example, though the embodiment given above explains the case where the memory cells are selected by the address non-multiplex system, it is also possible to implement the invention using an address multiplex system, though not regular, by making the bit number of the X system address greater than the bit number of the Y system address and letting the word block selection bits be contained in the X system address.

Figure 2A:
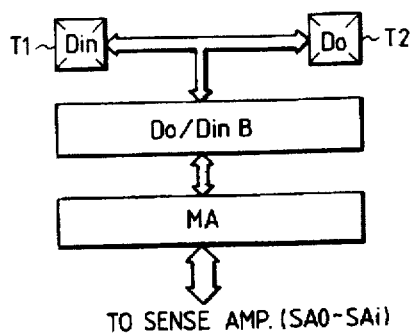
FIGS. 2A to 2D are explanatory views of the embodiment when the present invention is applied to a 4-M bits DRAM.
Figure 2B:
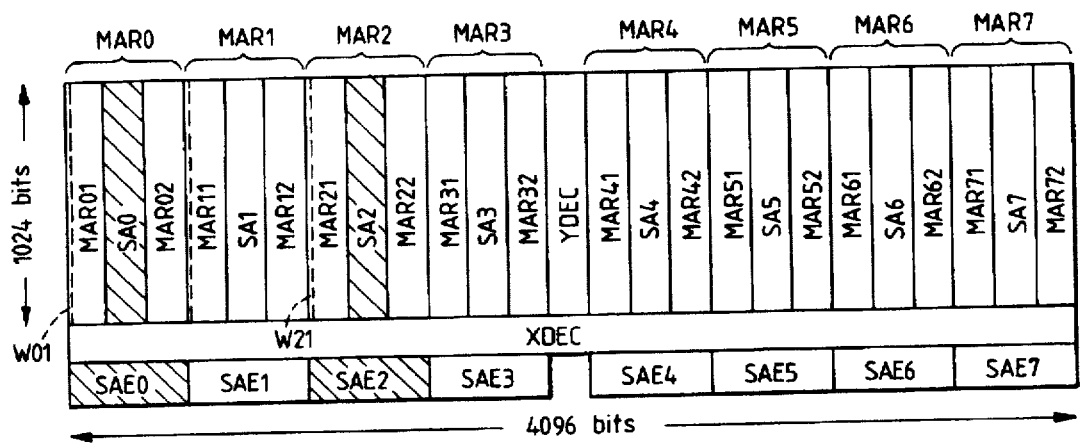
Figure 2C:
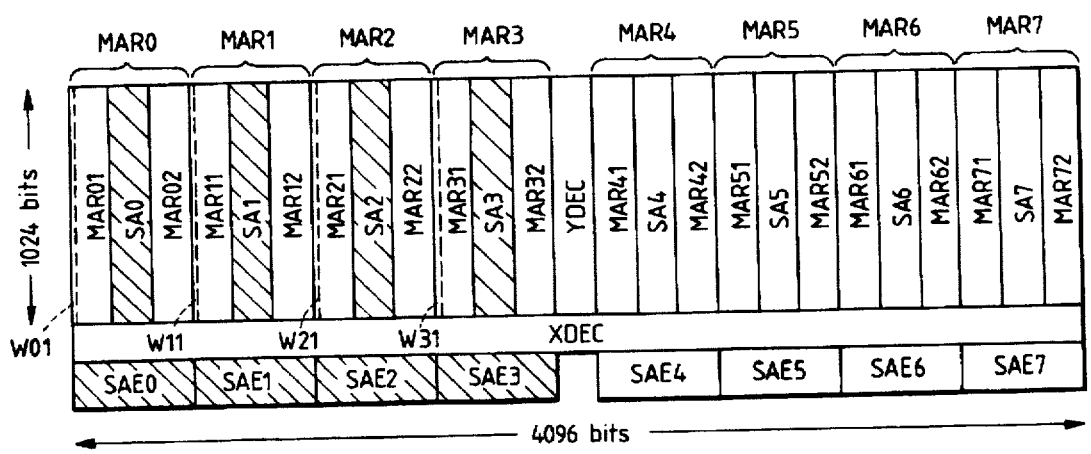
Figure 2D:
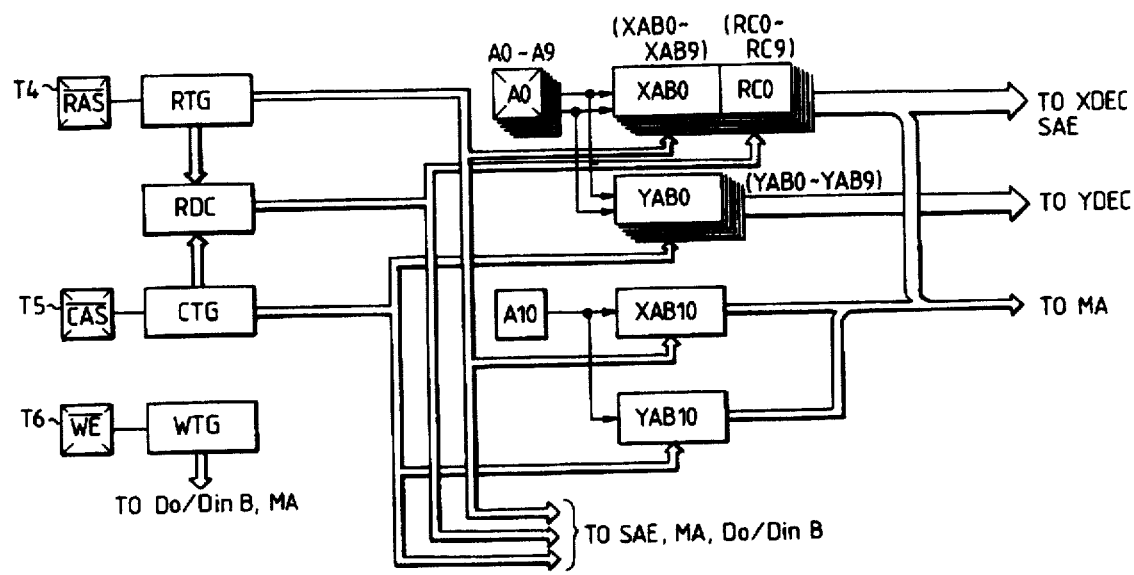

FIGS. 2A to 2D show another embodiment of the present invention. FIGS. 2B and 2C show the block with the memory array portion being the center and FIGS. 2A and 2D show its peripheral circuit blocks. Here, the blocks indicated by oblique lines in FIG. 2B represent those blocks which become the operational at the time of normal read and write operation. The blocks indicated by oblique lines in FIG. 2C represents the blocks which becomes operational at the time of refresh. The memory array shown in FIG. 2B or 2C has a structure consisting of 4,096 bits memory cells in the X direction and 1,024 bits memory cells in the Y direction and the memory array is divided into eight mats (MAR 0~7). Each mat is equipped with 1,024 sense amplifiers or in other words, 1,024×8 sense amplifiers, in total, are provided. This embodiment employs the address multiplex system. In other words, it is the system which inputs the X address and the Y address in synchronism with the RAS signal and the CAS signal, respectively. The refresh cycle of 4-M bits DRAM is 1,024 times per 16 ms and it is necessary to read out 4,096 bits memory cells at a time and to operate the sense amplifiers. In accordance with the conventional technique, read (rewrite) of 4,096 bits has been made in the normal read and write operation as well as in the refresh cycle.

In accordance with the present invention, this embodiment reduces the number of sense amplifiers operating simultaneously at the time of normal read and write operation (referred to as the "normal operation" at times) to a number smaller than the number of the sense amplifiers operating simultaneously at the time of the refresh operation. Namely, in the refresh operation, four word lines W01, W11, W21 and W31 are selected from the four memory arrays MAR0~MAR3 and at the same time, the sense amplifiers SA0~SA3 of each mat are operated to make the read amplification and re-write operations. Unlike the normal operation, it is not necessary to connect the amplified memory cell data to the output peripheral circuit in the refresh operation.

FIG. 2A shows an example of the data input/output peripheral circuit. The circuit includes a data input terminal T1, a data output terminal T2, a data input/output buffer Do/Din B and a main amplifier MA. The main amplifier is connected to each sense amplifier SA0~SA7.

In the normal operation, one word line WO1, W21 of each memory array MAR0, MAR2 is caused to rise and 2,048 in total of sense amplifiers of SA0, SA2 are operated to make read amplification. It is not at all necessary to make the simultaneous read amplification of 4,096 bits as is necessary in the refresh operation, because the bit for which read/write is made in practice is only one bit or several bits.

Incidentally, sense enable circuits SEA0~SEA7 are circuit blocks for operating the corresponding sense amplifiers SA0~SA7. In accordance with this embodiment, the number of bits to be read and amplified in the normal operation becomes ½ of the number at the time of the refresh operation so that the operating current can be reduced to about ½.

Figure 8:
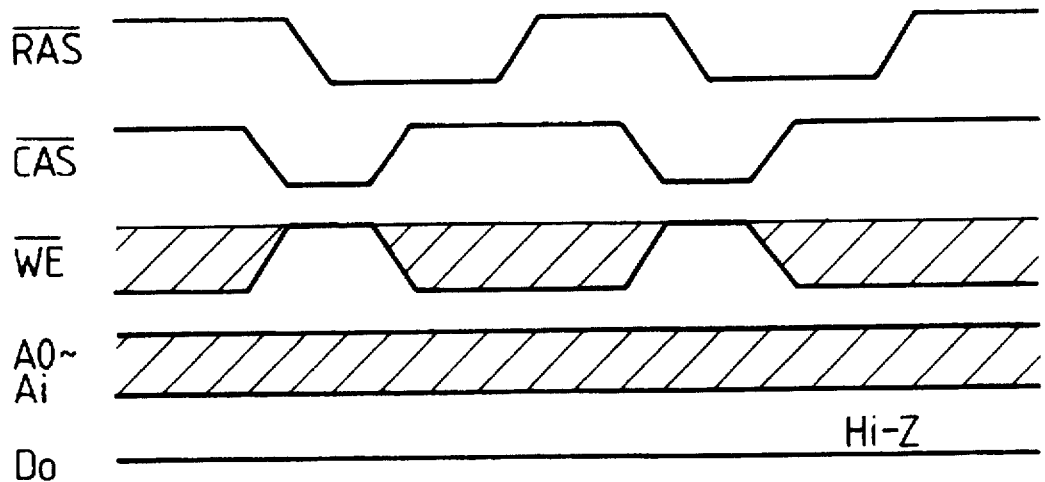

FIG. 2D is a block diagram of peripheral circuits for control. On receiving the $\overline{RAS}$ signal inputted from the terminal T4, a first timing signal generation circuit RTG determines a reception timing of the X address, the rise timing of the word line and the operation timing of the sense amplifier. On receiving the $\overline{CAS}$ signal inputted from the terminal T5, a second timing signal generation circuit CTG determines the reception timing of the Y address and the data output timing. On receiving the output signals of the first and second timing signal generation circuits RTG and CTG, a refresh mode judgement circuit judges (or determines whether the operation mode is the normal operation mode or the refresh operation mode. The mode judgement method will be explained with reference to FIG. 8. As shown in the drawing, if the $\overline{CAS}$ signal is at the low level when the $\overline{RAS}$ signal falls, the refresh mode judgement circuit RDC judges (or determines) the mode as the refresh mode. This judgement method is referred to as "CBR" ($\overline{CAS}$ before $\overline{RAS}$). When the mode is judged as the refresh mode, reception of the X address is stopped and the word line as the object of the refresh operation is decided in accordance with the internal refresh address determined by internal refresh counters RC0~RC9. At the same time, the operation sense amplifier is decided. Incidentally, the Y address buffer YAB, the main amplifier MA and the input/output control buffer Do/Din B are inactivated by the output signal of the first timing signal generation circuit RDC so as to reduce the power at the time of refresh. The internal refresh counters RC0~RC9 have the function of being incremented with respect to the CBR cycle.

When the mode is judged as the normal mode, the read amplification operation is made by making access to $2^{11}$ (= $\sqrt{4Mbits=2^{22}}$) or 2048 bits determined by eleven addresses of the X addresses A0~A10.

Figure 3A:
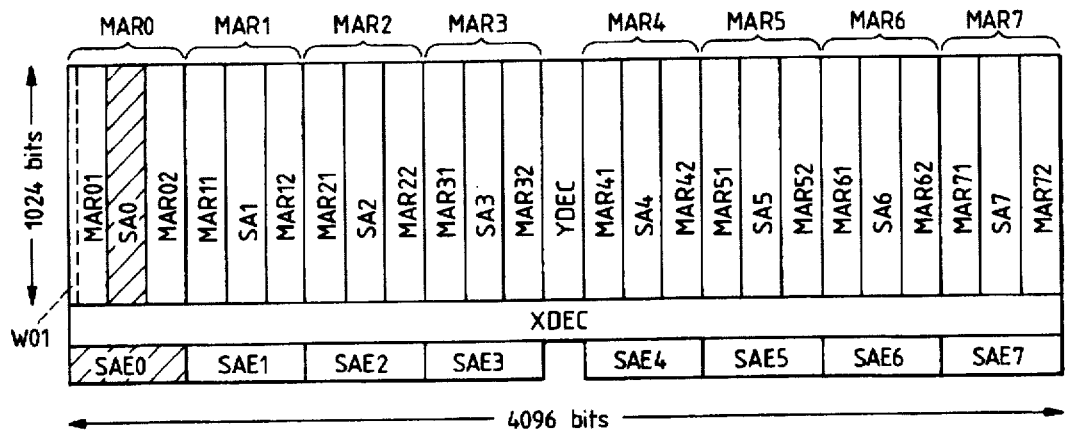
FIGS. 3A and 3B are explanatory views of another embodiment when the present invention is applied to a 4-M bits DRAM.
Figure 3B:
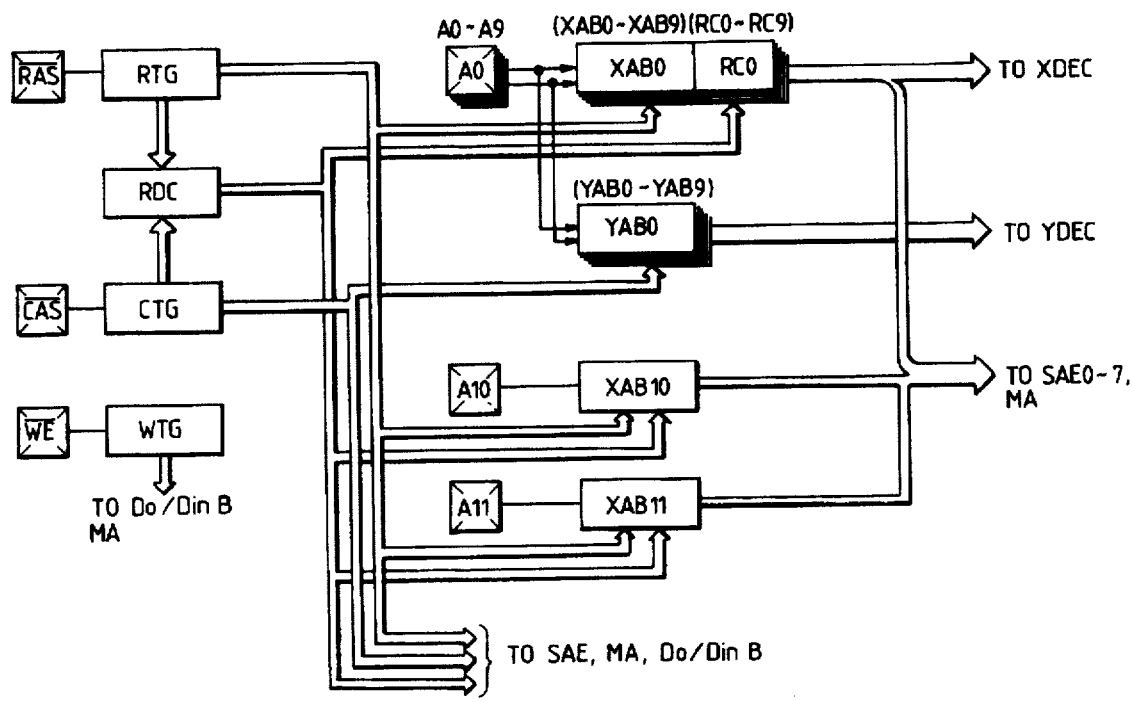

FIG. 3A is a block diagram of a 4-M bits refresh type memory device in accordance with another embodiment of the present invention. The array configuration is the same as that of FIG. 2B or 2C. This embodiment employs the address multiplex system but 12 addresses among 22 addresses are used as the X address and 10 addresses are used as the Y address. The addresses X0~X11 are inputted from address pins A0~A11 at the fall timing of the $\overline{RAS}$ signal and the addresses Y0~Y9 are inputted at the fall timing of the $\overline{CAS}$ signal. In this embodiment, 4096 selections can be made by the twelve X addresses. At the time of the normal read and write operation, therefore, one (WO1) of the 4,096 word lines is selected and at the same time, only one column (sense amplifier SAO), that is, 1,024 sense amplifiers, are operated to make read amplification. At the time of refresh, the refresh counter address is inputted by the output of the refresh mode judgement circuit RDC and four word lines and four columns of sense amplifiers are operated. At the same time, refresh amplification of 4,096 bits is conducted. The selection state in the refresh operation is the same as that of FIG. 2C. In this embodiment the X address pins are increased by one and thus the word lines and the sense amplifiers in the normal operation can be reduced to ¼ of those of the refresh operation so that the total consumed power can be reduced drastically in comparison with the prior art technique. Though the number of address pins increases by one in this system, the X addresses may be inputted in using another pin, which is not used in synchronism with $\overline{RAS}$ (e.g. Dout pin) instead of simply increasing the address pins by one. FIG. 3B is a block diagram of peripheral circuits for control in order to accomplish the embodiment shown in FIG. 3A. The explanation of the function of each block will be omitted because it is the same as that of each block represented by the same reference numeral in FIG. 2D.

Figure 4A:
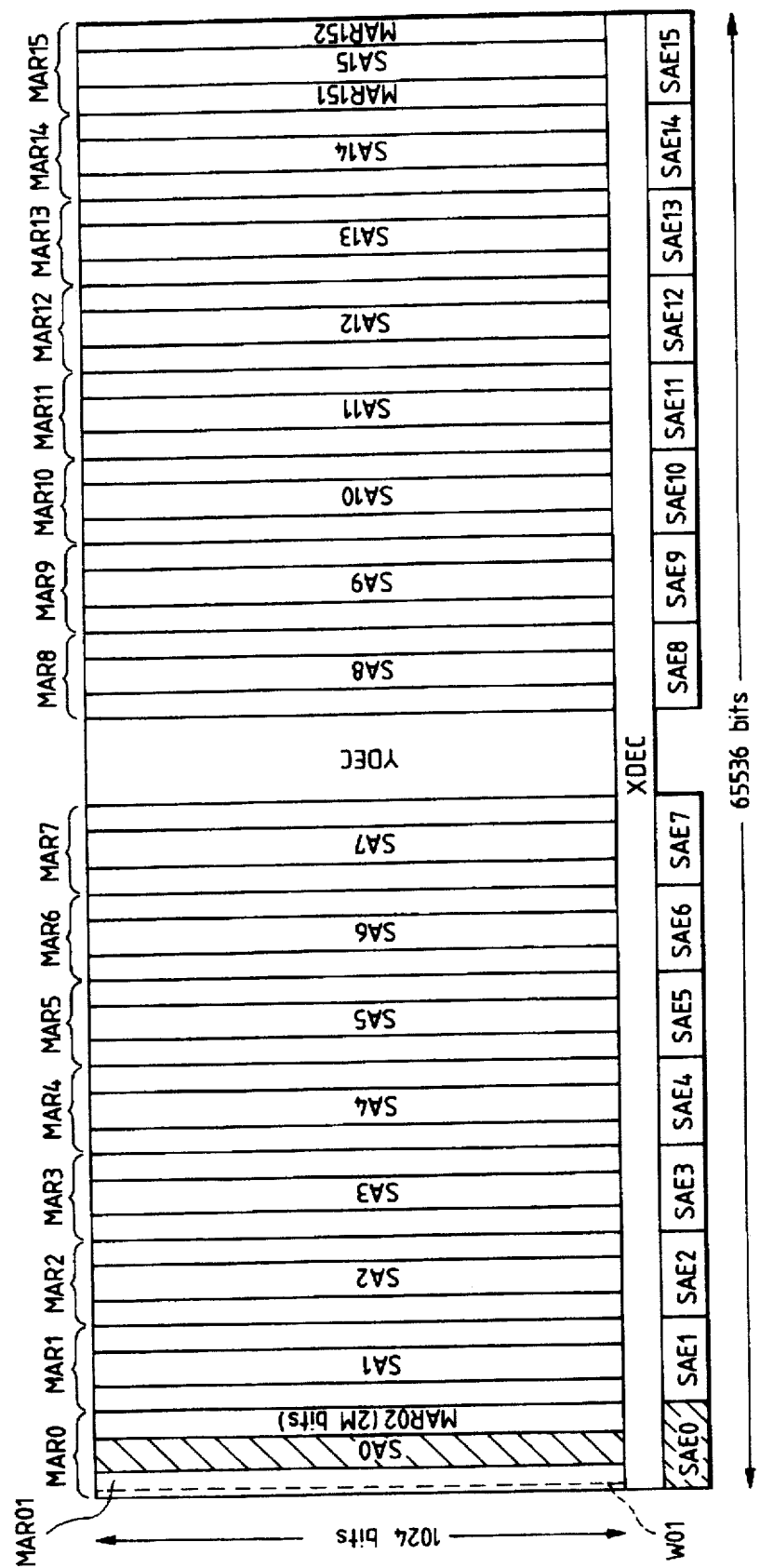
FIGS. 4A and 4B are explanatory views of the embodiment when the present invention is applied to a 64-M bits DRAM.

FIG. 4A shows still another embodiment of the present invention. The drawing shows a 64-M bits refresh type semiconductor device. The memory of this embodiment is a dynamic RAM employing the address non-multiplex system. The address non-multiplex system is the one that inputs the X address signal and the Y address signal at the same timing into the memory. In this embodiment a greater number of the number of addresses are used as the word line selection addresses.

In FIG. 4A, 16 address signals among 26 address signals A0~A25 are used for the word selection and the remaining 10 addresses are used for the data line selection. The array has a memory cell structure such that 65,536 bits are arranged in the word line direction and 1,024 bits are arranged in the data line direction.

FIG. 4A shows the normal operation state or the state where one of the word lines of one mat MAR0 among the 16 memory array mats MAR0~MAR15 is caused to rise and only the sense amplifier column SAO is operated in response thereto. In other words, one word line WO1 can be selected by the 16 X addresses and at the same time, one column of sense amplifier SAO consisting of 1,024 sense amplifiers are operated by the sense amplifier enable circuit SAEO to effect a read amplification.

At the time of the refresh operation, on the other hand, the refresh operation (read amplification) of 16K bits must be made simultaneously assuming that the refresh of a 64M bits DRAM is 4,096/64 ms.

Figure 7:
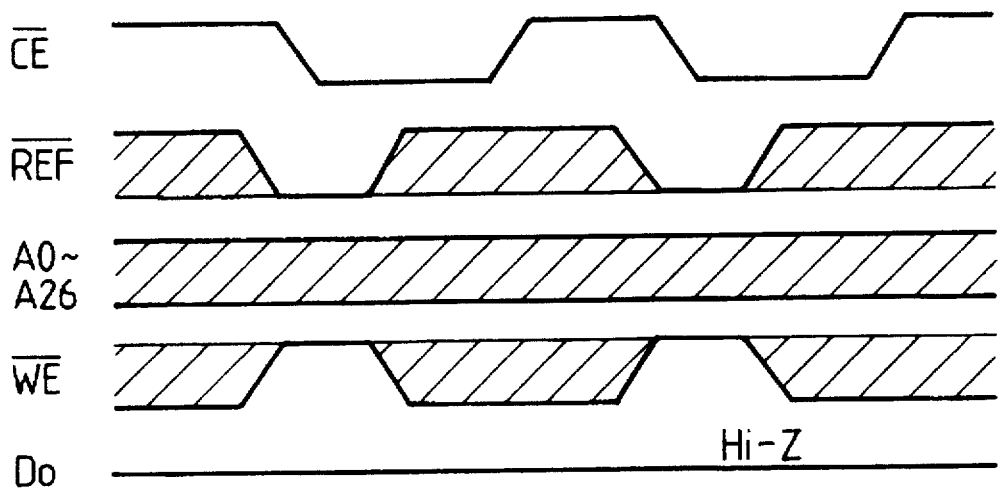
FIGS. 7 and 8 are waveform diagrams useful for explaining the operation of the embodiments of FIGS. 2A–2D and FIG. 4B, reprectively described.

At the time of refresh, one word line of each of the memory array mats MAR0~MAR15 is caused to rise and refresh of 1,024×16~64K bits is effected by operating 16 columns of sense amplifiers SA0~SA15. According to the present invention, the power at the time of the normal operation is reduced to about 1/16 of that of the refresh operation and the charge/discharge capacity of the bit lines in the normal operation can be made only that of 1,024 bits. Accordingly, the sense amplifier operation time can be shortened and the access time can be sped up. In the case of a CMOS DRAM of the address non-multiplex type, the refresh mode is entered provided that the refresh signal $\overline{REF}$ input terminal T7 is provided and the refresh signal $\overline{REF}$ is LOW when the chip enable input signal $\overline{CE}$ is LOW. An example of the refresh cycle input condition is shown in FIG. 7.

Figure 4B:
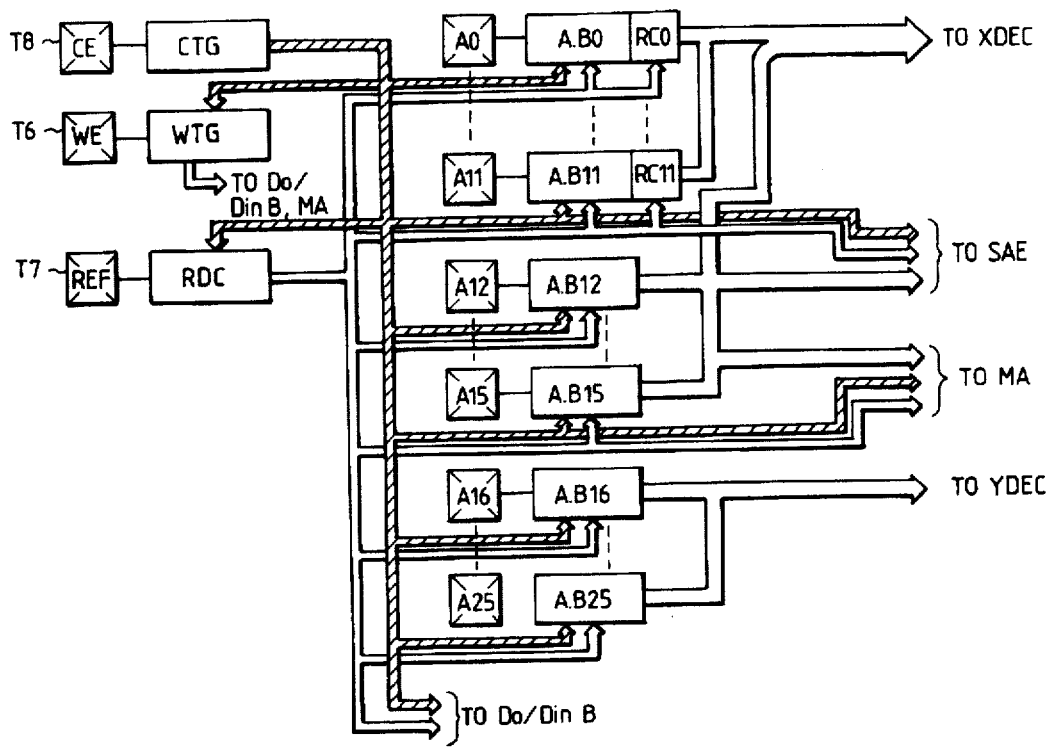

In FIG. 4B, whether or not the refresh mode is to be entered is judged primarily by the refresh judgement circuit RDC and in the case of the refresh mode, all the address buffers AB0~AB25, the main amplifier MA and the input/ output control buffer Do/Din B are inactivated and at the same time, 16 word lines are selected by the address signals generated by built-in refresh counters RC0~RC11. Furthermore, 16 columns of sense amplifiers SA0~SA15 are multi-selected and operated. In this array configuration, an example of the array configuration employing the shared sense amplifier system using one column of Y decoders is shown.

Figure 5B:
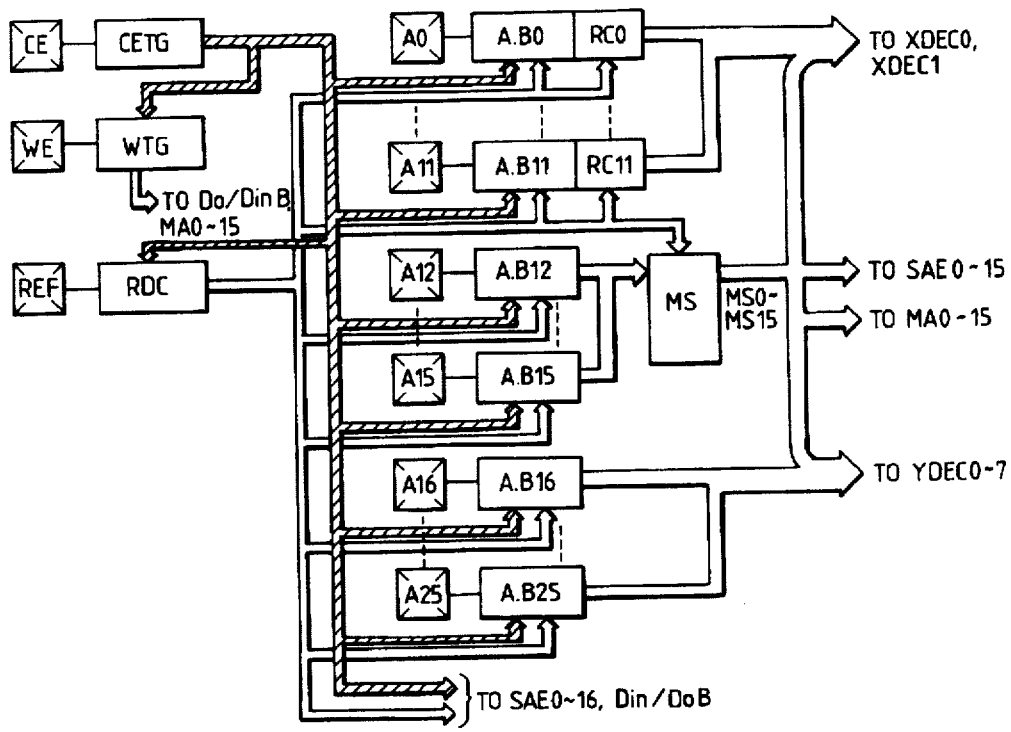
FIGS. 5A and 5B are explanatory views of another embodiment when the present invention is applied to the 64-M bits DRAM.
Figure 5A:
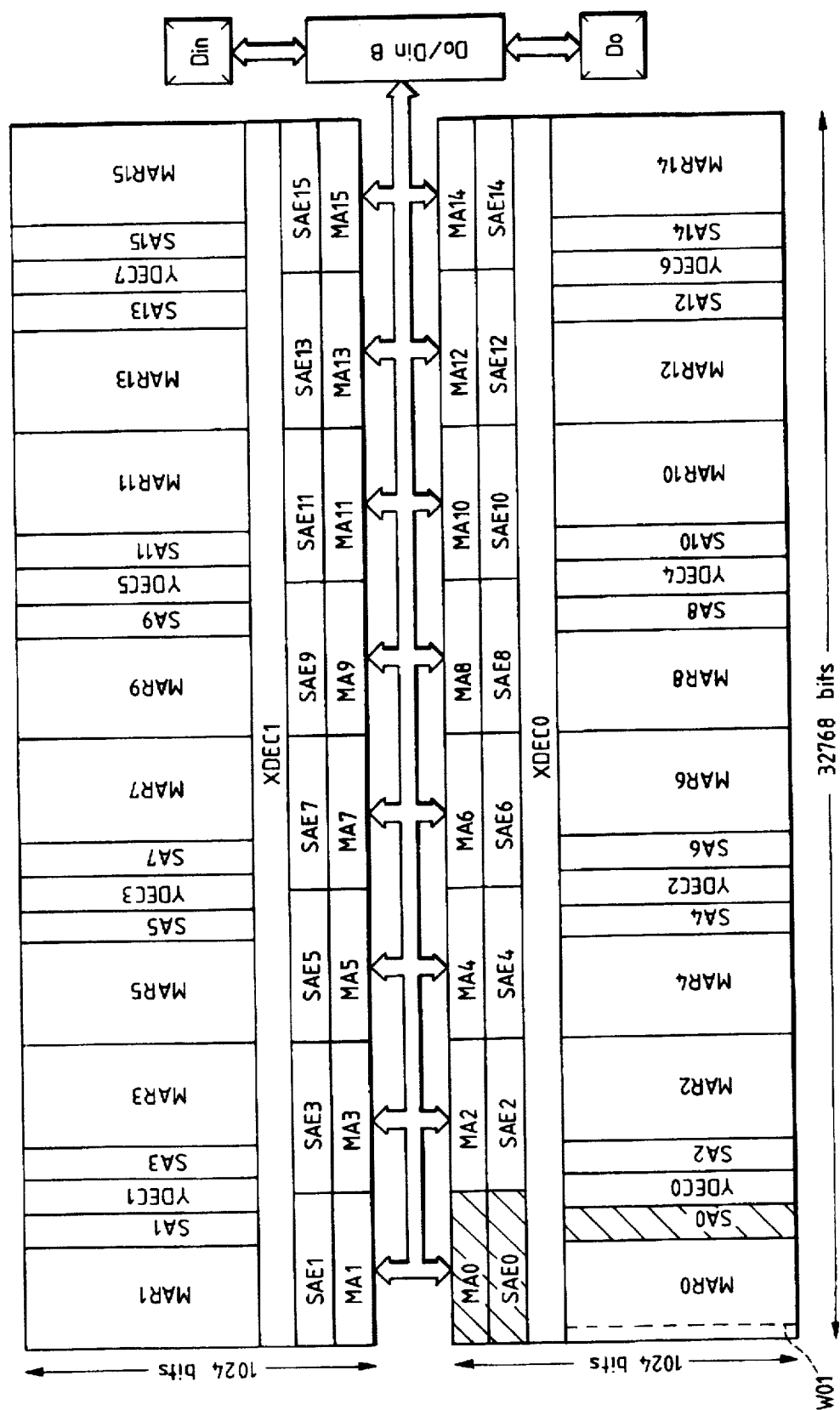

FIG. 5A shows an example of the layout wherein 32,768 bits of memory cells are arranged in the X direction and 2,048 bits, in the Y direction in the memory cell array in a 64M bits DRAM and they are divided into two segments in the vertical direction. In this embodiment the memory area is divided into 16 mats (memory arrays MAR0~MAR15) and one column of sense amplifiers SA0~SA15 are disposed for each mat, but one Y decoder column (YDEC0~YDEC7) are shared by two mats. This embodiment employs the address non-multiplex system wherein 16 addresses are allotted as the X addresses and 10 addresses are allotted as the Y addresses. This embodiment is characterized in that selection of one mat among the 16 mats is made exclusively by the output of the mat selection circuit MS. FIG. 5B shows an example of peripheral circuits including the mat selection circuit MS. The mat selection circuit MS decodes the X address allotment signals A12~A15 and outputs mat selection signals MS0~MS15. In the normal operation, one mat address signal is selected by the input address signal A12~A15 and selection of the sense amplifier enable circuit SAE, the sense amplifier column SA, the Y decoders YDECs and the main amplifier MA is made. FIG. 5A shows the state where the block indicated by oblique lines is selected by way of example. In the refresh mode, the mat address signals MS0~MS15 are multi-selected by the output signal of the refresh judgement circuit RDC and the refresh circuits of several or all mats are operated. At this time the output signal of the refresh judgement circuit RDC inactivates all the address buffers AB, the main amplifier MA and the data input/output buffer Do/Din B. The mat selection signal control system of this embodiment makes it possible to switch easily the normal operation and the refresh operation.

Figure 6A:
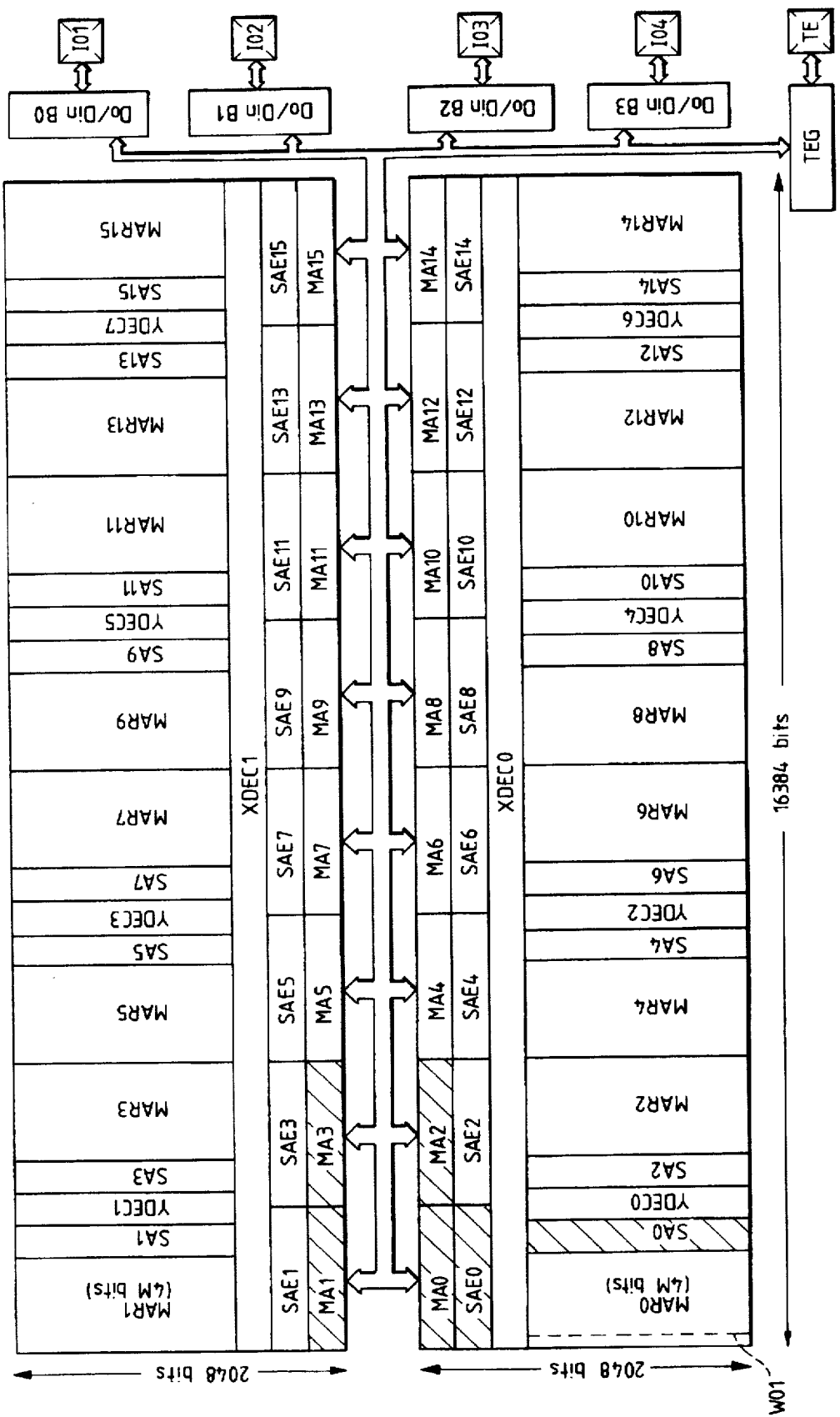
FIGS. 6A and 6B are explanatory views of still another embodiment when the present invention is applied to the 64-M bits DRAM.
Figure 6B:
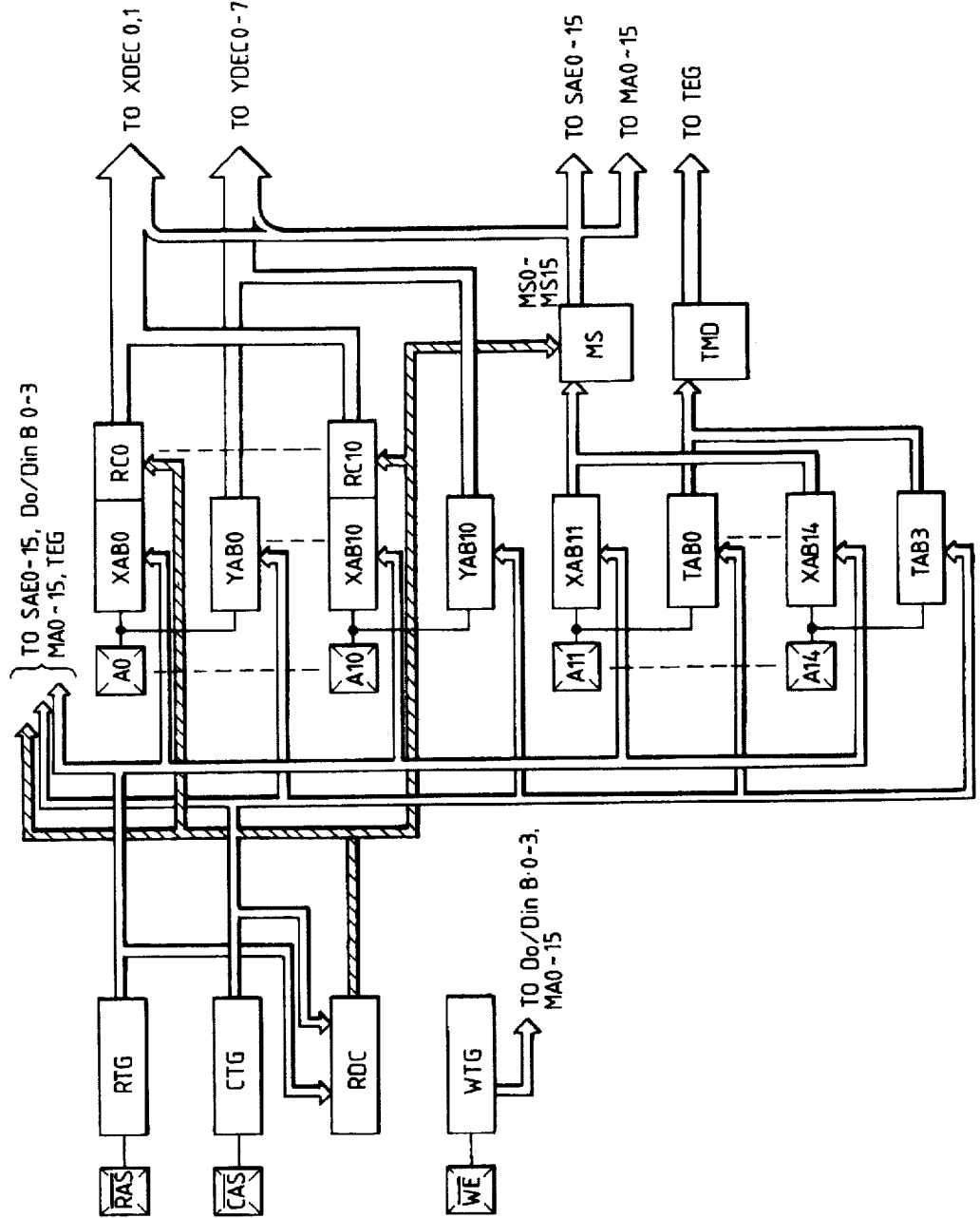

If the address multiplex system is employed for the 64M bits DRAM, this embodiment makes it possible to select simultaneously up to 8K bits and to make read amplification of bits which are some multiples of 8K bits at th time of refresh. FIG. 6A shows still another embodiment of the present invention. The drawing shows the embodiment wherein the address multiplex system is employed for the 64M bits DRAM and the number of X addresses is increased to 15 with the number of Y addresses being 11. Selection of 2,048 bits becomes possible by 15 X addresses, and one word line of one mat among 16 mats and one column of SA (2,048) can be selected. This embodiment shows the 4 bits configuration. Namely, 4-bit data connected to one word line (e.g. WO1) is transmitted to the main amplifier MA0~MA4, amplified by it, then transmitted to the input/output control circuit Do/Din B and outputted from it in the read and write operation. At the time of refresh, the mat address signals are multi-selected by the output of the CBR judgement circuit RDC shown in FIG. 6B in accordance with the output of the refresh counter RC0~RC10 and read amplification of the necessary bit number is made. This is the same as in the embodiment shown in FIG. 5A. This embodiment is characterized in that a test logic signal is inputted in synchronism with the $\overline{CAS}$ signal from the address pins (A11~A14 Dins in this embodiment) for which only the input of the X address is necessary. In other words, these A11~A14 pins are not necessary for the input of the Y address signal. Therefore, as an example, the chip is provided with the function of calculating a plurality of kinds of logics between the plurality of output bits and the kinds are selected by the test logic address signal inputted in synchronism with the $\overline{CAS}$ signal. As shown in the block diagram of FIG. 6B, the X address buffers XAB~XAB10 and the Y address buffers YAB0~YAB10 are coupled to the address terminals A0~A10 and the X address buffers XAB11~XAB14 and the test logic selection buffers TAB0~TAB3 are coupled to the address of the address terminals A11~A14. The output signal of each test logic selection circuit AB10~3 is decoded by a test mode decision circuit TMD and is then supplied to a test logic circuit TEG. This test logic circuit can calculate a predetermined logic between each output data. In other words, 16 kinds in total of logics (e.g. AND, EOR, increment, decrement, etc.) can be calculated by the four test address buffers TAB0~3. Though this embodiment represents the case of the logic of the output values by way of example, many other tests such as comparison with an anticipated value can be made.

[Embodiment for Accomplishing the Second Object of the Invention]

Figure 9:
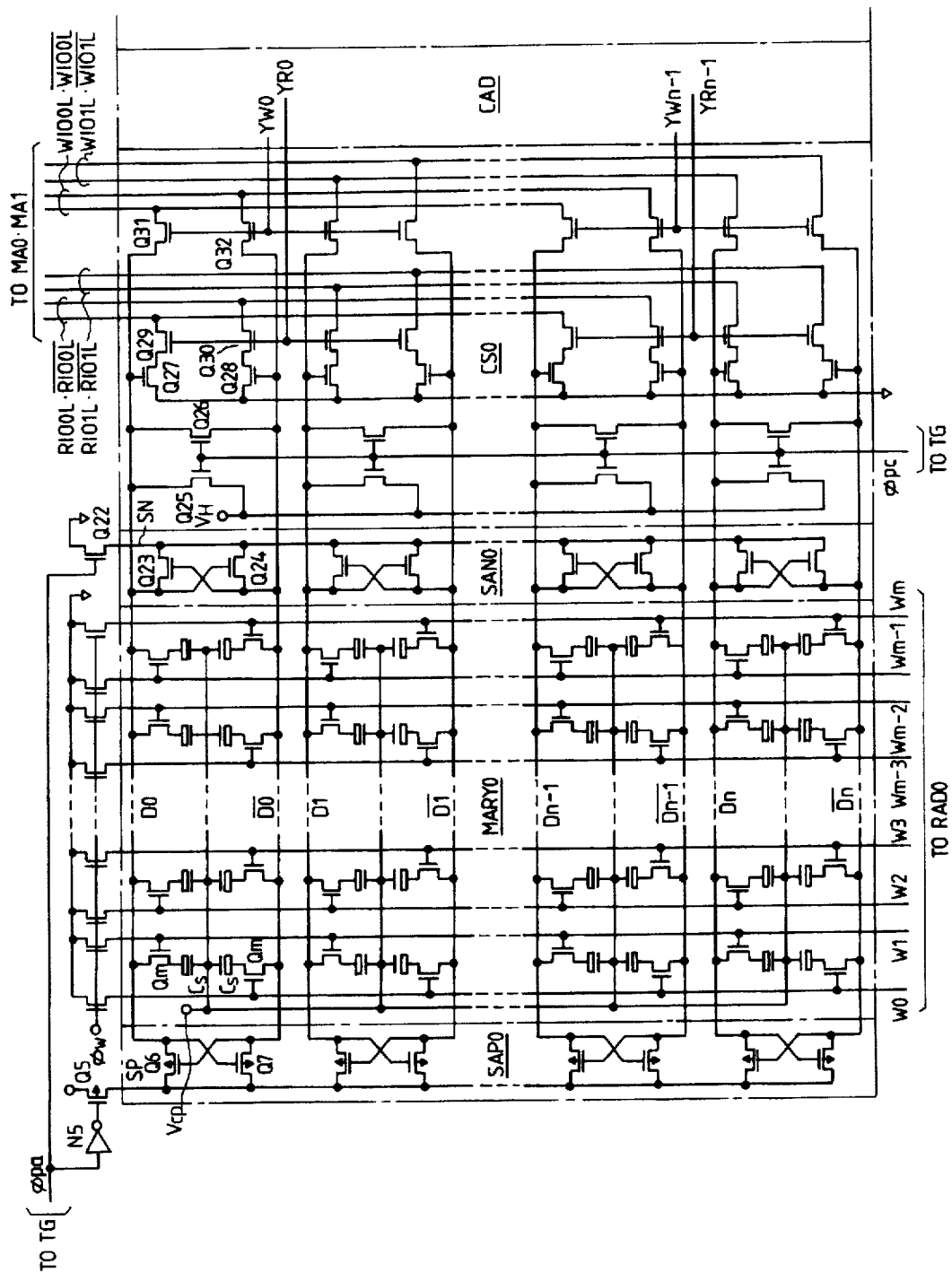
FIG. 9 is a circuit diagram showing an embodiment of the memory array and its peripheral circuit of dynamic RAM to which the present invention is applied.
Figure 10:
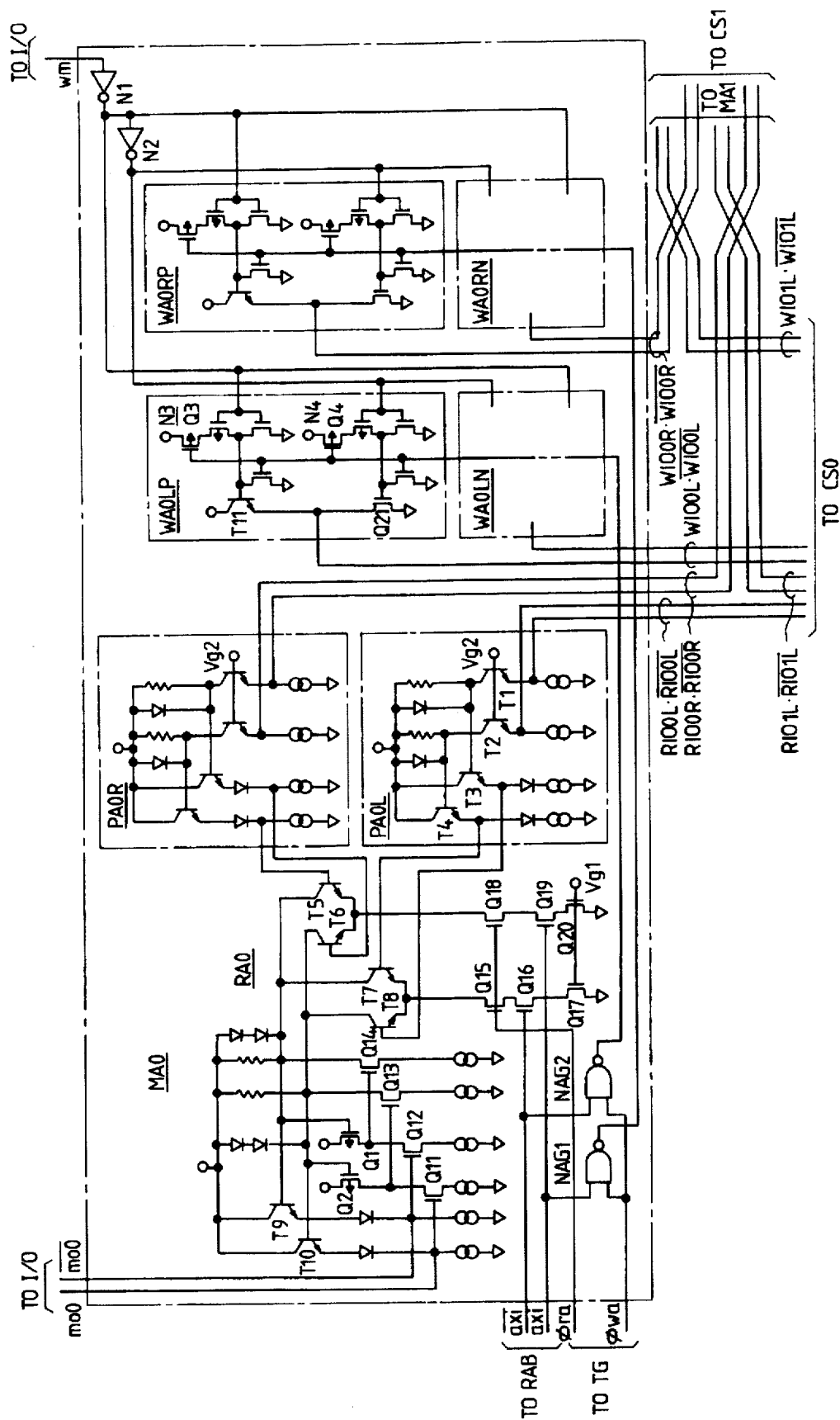
FIG. 10 is a circuit diagram showing an embodiment of the main amplifier of the dynamic RAM shown in FIG. 1.
Figure 11:
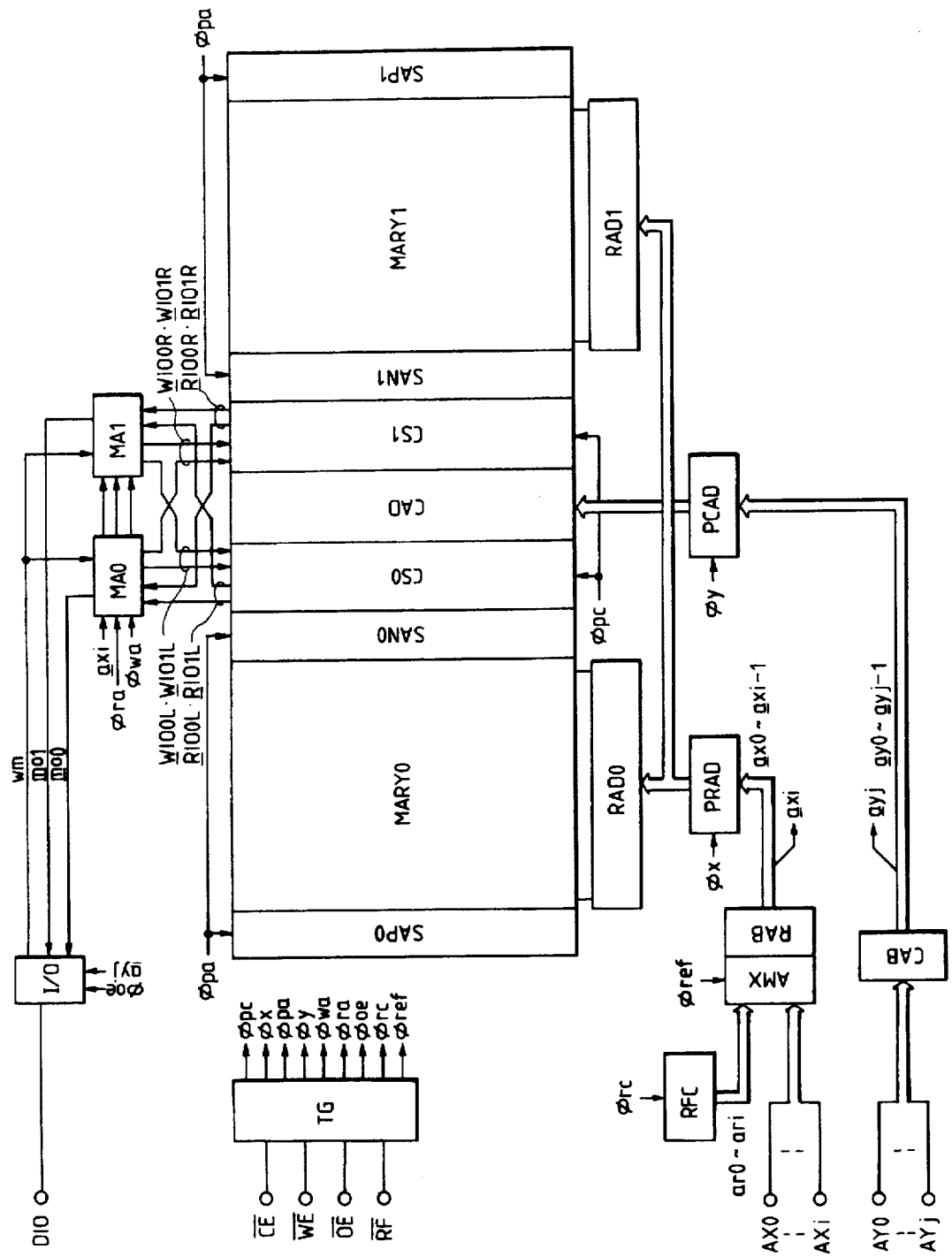
FIG. 11 is a block diagram showing an embodiment of the dynamic RAM containing the memory array of FIG. 9 and the main amplifier of FIG. 10.

FIG. 3 is a block diagram showing an embodiment of the dynamic type RAM to which the present invention is applied. FIGS. 9 and 10 are circuit diagrams showing an embodiment of the memory array MARY0 and its peripheral circuit and its main amplifier MA0 of a dynamic type RAM shown in FIG. 11. The outline of the construction and operation of the dynamic type RAM in this embodiment will be explained with reference to these drawings. The circuit devices constituting each circuit block of FIGS. 9 to 11 are formed on one semiconductor substrate such as single crystal silicon by known semiconductor integrated circuit fabrication technique, though it is not particularly limitative. In FIGS. 9 and 10, MOSFETs provided with arrow at their channel (back-gate) portions are of the P-channel type and are distinguished from the N-channel MOSFETs not provided with arrow. All the bipolar transistors shown in the drawings are of the NPN type.

In this embodiment, a complementary common data line for write and a complementary common data line for read are disposed separately in the dynamic type RAM, as will be described later. Among them, the write complementary common data line is directly connected to each complementary data line of the memory array through a switch MOSFET which is turned on selectively in accordance with the column address signal in the same way as in the conventional dynamic type RAM. However, the read complementary common data line is indirectly connected to each complementary data line of the memory array MARY through a similar MOSFET disposed in series between the read complementary common data line and the ground potential of the circuit and through an amplification MOSFET whose gate is coupled to the corresponding complementary data line of the memory array. Furthermore, a read amplifier of a current sense type is connected to the read complementary common data line and its signal amplitude is limited to a minimum necessary value. Accordingly, the read operation of the dynamic type RAM can be sped up, the driving capacity required for the unit amplification circuit of the sense amplifier is reduced and power consumption of the read operation is reduced.

Furthermore, if the arrangement of the input/output terminals of the dynamic type RAM of this embodiment is designed to be the same as that of the conventional static type RAM, so-called "pseudo-static type RAM" can be formed. Accordingly, the row address signals or the X address signals AX0~AXi and the column address signals or the Y address signals AY0~AYi are inputted through the separate external terminals. The chip enable signal $\overline{CE}$, the write enable signal $\overline{WE}$ and the output enable signal $\overline{OE}$ are supplied as the control signals to the dynamic type RAM. Though not particularly limitative, the dynamic type RAM has also the function of refreshing the stored data in accordance with the refresh control signal $\overline{RE}$.

Though not particularly limitative, the dynamic type RAM in this embodiment includes two sets of memory arrays MARY0 and MARY1 that are arranged symmetrically, sense amplifiers SAP0, SAP1 and SAN0, SAN1 disposed so as to correspond to these memory arrays and column switches CS0 and CS1, as shown in FIG. 11.

As typified by the memory array MARY0 in FIG. 1, each of the memory arrays MARY0 and MARY1 includes m+1 word lines W0~Wm disposed in the vertical direction, n+1 sets of complementary data lines D0•$\overline{D0}$~Dn•$\overline{Dn}$ and (m+1)×(n+1) dynamic type memory cells disposed in matrix at the points intersection between these word lines and the complementary data lines.

Each of the dynamic type memory cells constituting each memory array MARY0, MARY1 includes a data storage capacitor Cs and an address selection MOSFET Qm. The drains of the address selection MOSFETs Qm of m+1 memory cells arranged in the same column of each memory array MARY0, MARY1 are alternately connected to the non-inversion or inversion signal lines of the corresponding complementary data lines D0•$\overline{D0}$~Dn•$\overline{Dn}$ with predetermined regularity. The gates of the address selection MOSFET Qm of n+1 memory cells disposed in the same row of each memory array MARY0~MARY1 are connected commonly to the corresponding word lines W0~Wm. A predetermined cell voltage $V_{cp}$ is supplied to the other electrode of the data storage capacitor $C_s$ of each memory cell.

The word lines W0~Wm constituting the memory arrays MARY0~MARY1 are connected to the corresponding row address decoders RAD0~RAD1 and are alternately selected.

A predetermined pre-decode signal is supplied from a pre-row address decoder PRAD to the row address decoders RAD0 and RAD1. The row address decoders RAD0 and RAD1 bring selectively the corresponding word lines W0~Wm of the memory array MARY0 or MARY1 into the high level selection state in accordance with these pre-decode signals.

Though not particularly limitative, i bits of the complementary internal address signals ax0~axi-1 (the non-inversion internal address signal ax0 and the inversion internal address signal $\overline{ax0}$ will be hereinafter expressed by the complementary internal address signals ax0) other than the uppermost order bit are supplied from the row address buffer RAB to the pre-row address decoder PRAD. A timing signal $\phi_X$ is also supplied to a later-appearing timing generation circuit TG. The pre-row address decoder PRAD is selectively operated when the timing signal $\phi_X$ is at the high level. Under this operation state, the pre-row address decoder decodes the complementary internal address signals ax0~axi-1 in a predetermined combination, generates the pre-decode signal described above and supplies it to the row address decoder RAD.

The row address buffer RAB holds the row address signal supplied thereto through an address multiplexer AMX and generates the complementary internal address signals ax0~axi described above on the basis of these row address signals.

In the address multiplexer AM, i+1 bit X address signals AX0~AXi are supplied to one of its input terminals through external terminals AX0~0Xi and refresh address signals ar0~ari are supplied from the refresh address counter RFC to the other input terminal. The timing signal $\phi$ref is supplied further from the timing generation circuit TG to this address multiplexer AMX. When the dynamic type RAM is under the refresh mode, this timing signal $\phi$ref is set selectively to the high level. When the timing signal $\phi$ref is at the low level, the address multiplexer AMX selects the address signals AX0~AXi described above and transmits them as the row address to the row address buffer RAM. When the timing signal $\phi$ref is at the high level, it selects the refresh address signals ar0~ari and transmits them as the row address signals to the row address buffer RAM.

Though not particularly limitative, the refresh address counter RFC makes the counting operating in accordance with the timing signal $\phi$rc supplied from the timing generation circuit TG and generates the refresh address signals ar0~ari.

The complementary data lines constituting the memory array MARY0 and MARY1 are connected to the corresponding units circuit of the corresponding sense amplifiers SAP0 and SAP1 on one hand, and are connected to the corresponding unit circuits of the corresponding sense amplifiers SAN0 and SAN1, on the other. Furthermore, they are connected to the corresponding unit circuits of the column switches CS0 and CS1.

The sense amplifiers SAP0 and SAP1 include n+1 unit circuits disposed in such a manner as to correspond each complementary data line of each memory array MARY0, MARY1. As shown typically in FIG. 9, each of these unit circuits includes a pair of P-channel MOSFETs Q6 and Q7 disposed between the common source line SP and the each complementary data line D0•$\overline{D0}$~Dn•$\overline{Dn}$ of the corresponding memory array. The gates and drains of these transistors Q6 and Q7 are commonly cross-connected to one another in the latch form. A power source voltage $V_{cc}$ of the circuit is selectively supplied to the common source line SP through a driving MOSFET Q5 of the P-channel type which is selectively turned ON in accordance with the timing signal $\phi$pa supplied from the timing generation circuit TG.

Similarly, each sense amplifier SAN0, SAN1 includes n+1 unit circuits disposed in such a manner as to correspond to each memory array MARY0, MARY1. Each of these unit circuits includes a pair of N-channel MOSFETs Q23 and Q24 disposed between the common source line and each complementary data line D0•$\overline{D0}$~Dn•$\overline{Dn}$ of the corresponding memory array as shown typically in FIG. 1. The gates and drains of these MOSFETs Q23 and Q24 are cross-connected to one another in the latch form. The ground potential of the circuit is selectively supplied to the common source line SN through an N-channel driving MOSFET Q22 which is selectively turned ON in accordance with the timing signal $\phi$pa supplied from the timing generation circuit TG.

As described above, the P-channel MOSFETs Q6 and Q7 of each unit circuit of each sense amplifier SAP0, SAP1 and the N-channel MOSFETs Q23 and Q24 of the corresponding unit circuit of each sense amplifier SAN0, SAN1 constitute one unit amplification circuit. Each of these unit amplification circuits is selectively operative when the timing signal $\phi$pa described above is at the high level and the power source voltage $V_{cc}$ and ground potential of the circuit are supplied to the common source lines SP and SN. Under this operative state, each unit amplification circuit amplifies the very weak read signal outputted from the n+1 memory cells connected to the selected word line of the memory array MARY0, MARY1 through the corresponding complementary data line and generates a binary read signal of the high or low level.

Though not particularly limitative, each column switch CS0, CS1 includes n+1 unit circuits disposed in such a manner as to correspond to each complementary data line of each memory array MARY0, MARY1. As shown typically in FIG. 9, each unit circuit includes a pair of N-channel MOSFETs (first MOSFETs) Q31 and Q32 disposed between each complementary data line D0•$\overline{D0}$–Dn–$\overline{Dn}$ of each memory array MARY0, MARY1 and the write complementary data line (first common data line) WIO0L or WIO1L or WIO0R or WIO1R (here, the non-inversion and inversion signal lines WIO0L and $\overline{WIO0L}$ will be together expressed as the "write complementary common data line WIO0L"). The gates of these MOSFETs Q31 and Q32 are commonly connected to the gates of the pair of similar N-channel MOSFETs of the adjacent circuits and when the corresponding write data line selection signals YW0, YW2 or YWn-1 are supplied respectively from the column address decoder CAD, these transistors operate as the switch MOSFETs. Accordingly, two sets of complementary data lines D0•$\overline{D0}$–Dn–$\overline{Dn}$ are simultaneously selected when the dynamic type RAM is in the write mode and the corresponding write data line selection signal YW0, YW2 or YWn-1 is selectively at the high level, and are connected selectively to the write complementary common data line WIO0 and WIO1R.

Each unit circuit of the column switch CS0, CS1 includes two pairs of N-channel MOSFETs Q27, Q28 (third MOSFETs) and Q29, Q30 (second MOSFETs) disposed in series between the ground potential of the circuit and the read complementary common data line (second common data line) RIO0L or RIO1L or RIO0R or RIO1R. Among them, a pair of MOSFETs Q27 and Q28 function as the amplification MOSFETs as their gates are connected to the non-inversion signal line and inversion signal line of the corresponding complementary data line D0•$\overline{D0}$–Dn•$\overline{Dn}$ of the memory array MARY0, MARY1, respectively. The gates of the other pair of MOSFETs Q29 and Q30 are connected commonly to the gates of the similar pair of N-channel MOSFETs of the adjacent unit circuits and when the read data line selection signals YR0, YR2 to YRn-1 are supplied respectively from the column address decoder CAD, these transistors function as the switch MOSFETs. Accordingly, two sets each of the complementary data lines D0•$\overline{D0}$–Dn•$\overline{Dn}$ are selected simultaneously when the dynamic RAM is in the read mode and the corresponding read data line selection signals YR0, YR2 to YRn-1 are set selectively to the high level and are connected selectively to the read complementary common data lines RIO0L and RIO1L or RIO0R and RIO1R.

In other words, in the dynamic type RAM of this embodiment, two sets each of write complementary common data lines and read complementary common data lines are disposed separately and two sets each of complementary data lines of the memory arrays MARY0 and MARY1 are selected and connected selectively to the write or read complementary common data lines. At this time the write complementary common data lines are connected directly to the selected complementary data lines through the corresponding switch MOSFETs Q31 and Q32 of the column switch CS0 or CS1. However, the read complementary common data lines are connected indirectly through the gates of the corresponding amplification MOSFETs Q27 and Q28 of the column switch CS0 or CS1. Accordingly, the signal amplitude of the read complementary common data lines can be reduced and the read operation can be sped up.

Though not particularly limitative, each unit circuit of the column switches CS0 and CS1 contains a precharge circuit consisting of N-channel MOSFETs Q25 and Q26. The source and drain of MOSFET Q26 is connected to the corresponding complementary data lines D0•$\overline{D0}$–Dn•$\overline{Dn}$ of the memory array MARY0 or MARY1 and the timing signal φpc is supplied commonly to the gate of the transistor. The drain of MOSFET Q25 is connected to the non-inversion signal line D0~Dn of the corresponding complementary data lines of the memory array MARY0 or MARY1 and its source is connected to a predetermined constant voltage $V_H$. Though not particularly limitative, this constant voltage is set to ½ of the power source voltage $V_{cc}$ of the circuit or the half precharge level. The timing signal φpc is supplied commonly to the gate of MOSFET Q25. Both MOSFETs Q25 and Q26 are simultaneously turned ON when the timing signal φpc is at the high level and set all the complementary data lines D0•$\overline{D0}$–Dn•$\overline{Dn}$ of the memory arrays MARY0 and MARY1.

A predetermined pre-decode signal is supplied from the pre-column address decoder PCAD to the column address decoder CAD. The column address decoder CAD sets selectively the write data line selection signals YW0, YW2 through YWn-1 or the read data line selection signals YR0, YR2 through YRn-1 to the high level selection state in accordance with these pre-decoder signals.

Though not particularly limitative, j-bit complementary internal address signals ay0~ayj-1 other than the uppermost bit are supplied from the column address buffer CAB to the pre-column address decoder PCAD and the timing signal φy is also supplied to it from the timing generation circuit TG. The pre-column address decoder PCAD is brought selectively into the operative state when the timing signal φy is at the high level. Under this operative state, the pre-column address decoder PCAD decodes the complementary internal address signals ay0~ayj-1 in a predetermined combination, generates the pre-decode signal described above and supplies it to the column address decoder CAD.

The column address buffer CAB holds the (j+1)-bit Y address signals AY0~AYj supplied thereto through the external terminals AY0~AYj and generates the complementary internal address signals ay0~ayj described above on the basis of these Y address signals.

As typified by the main amplifier MA0 shown in FIG. 10, the main amplifiers MA0 and MA1 each contain two pairs of write amplifiers WA0LP•WA0LN and WA0RP•WA0RN and WA1LP•WA1LN and WA1RP•WA1RN, two pre-amplifiers PA0L, PA0R and PA1L PA1R and one read amplifier RA0, RA1.

Though not particularly limitative, the complementary common data lines WIO0 and WIO0R are connected to the output terminals of the corresponding write amplifiers WA0LP•WA0LN and WA0RP•WA0RN of the main amplifier MA0. The read complementary common data lines RIO0L and RIO0R are connected to the input terminals of the corresponding pre-amplifiers PA0L and PA0R of the main amplifier MA0. Similarly, the write complementary common data lines WIO1L and WIO1R are connected to the output terminals of the corresponding write amplifiers WA1LP•WA1LN and WA1RP•WA1RN of the main amplifier MA1 not shown in the drawing. The read complementary common data lines $\overline{RIO1L}$ and $\overline{RIO1R}$ are connected to the input terminals of the corresponding pre-amplifiers PA1L and PA1R of the main amplifier MA1.

Hereinafter, the definite construction and operation of the main amplifier MA0 will be described by way of example. Those of the main amplifier MA1 can be anticipated from MA0.

As shown typically in FIG. 10, the write amplifiers WA0LP·WA0LN and WA0RP·WA0RN each contain CMOS inverter circuits N3 and N4 and a bipolar transistor T11 and an N-channel MOSFET Q21 that receive the output signals of the invertor circuits N3 and N4, respectively. The power source voltage Vcc of the circuit is selectively supplied to the inverter circuit N3 through the P-channel MOSFET Q3, and the power source voltage Vcc of the circuit is selectively supplied to the inverter circuit N4 through the P-channel MOSFET Q4. The input terminal of the inverter circuit N3 is the non-inversion input terminal of each write amplifier and the input terminal of the inverter circuit N4 is the inversion input terminal of each write amplifier. The emitter of the bipolar transistor T11 and the drain of MOSFET Q21 are connected commonly and are the output terminal of each write amplifier and are connected to the non-inversion signal line or inversion signal line of the write complementary common data lines $\underline{WIO0L}$ and WIO0R, respectively.

The output signal wm of a later-appearing data input/output circuit I/O is inversed by an inverter circuit N1 and the resulting inversion signal is supplied to the non-inversion input terminals of the write amplifiers WA0LP and WA0RP of the main amplifier MA0. The inversion signal of the output signal of the inverter circuit N1 by an inverter circuit N2 or in other words, the output signal wm of the data input/output circuit I/O is supplied to the inversion input terminal of these write amplifiers. Similarly, the output signal of the inverter circuit N2, that is, the output signal wm of the data input/output circuit I/O, is supplied to the non-inversion input terminal of the write amplifiers WA0LN and WA0RN, and the inversion signal of the output signal wm of the data input/output circuit I/O by the inverter circuit N1 is supplied to their inversion input terminals. The output signal of a NAND gate circuit NAG2 is supplied to the gates of the P-channel MOSFETs Q3 and Q4 of the write amplifiers WA0LP and WA0LN. Similarly, the output signal of the NAND gate circuit NAG1 is supplied to the gates of the P-channel MOSFETs Q3 and Q4 of the write amplifiers WA0RP and WA0RN. The timing signal φwa from the timing generation circuit TG is supplied to one of the input terminals of the NAND gate circuits NAG1 and NAG2. The non-inversion internal address signal axi and inversion internal address signal $\overline{axi}$ are supplied respectively to the other input terminals of the NAND gate circuits NAG1 and NAG2 from the row address buffer RAB.

As described above, the write amplifiers WA0LP and WA0LN are selectively brought into the operative state when the output signal of the NAND gate circuit NAG2 is at the low level as the timing signal φwa is at the high level and the inversion internal address signal $\overline{axi}$ is at the high level. Under this operative state the write amplifiers AW0LP and WA0LN generate the non-inversion write signal and the inversion write signal in accordance with the output signal wm of the data input/output circuit I/O and send them to the write complementary common data lines WIO0L. At this time the signal amplitude of the write complementary common data lime $\underline{WIO0L}$ is the signal amplitude of substantially the full swing using as its high level the difference obtained by subtracting the base-emitter voltage of the transistor T11 from the power source voltage Vcc of the circuit and as its low level the ground potential of the circuit. Similarly, the write amplifiers AW0RP and WA0RN are brought selectively into the operative state when the output signal of the NAND gate circuit NAG1 is at the low level as the timing signal φwa is at the high level and the non-inversion internal address signal axi is at the high level. Under this operative state the write amplifiers WA0RP and WA0RN generate the non-inversion write signal and the inversion write signal in accordance with the output signal wm of the data input/output circuit I/O and send them to the write complementary common data line WIO0R. These write signals have the signal amplitude of substantially full swing. When the timing signal φwa is at the low level, the outputs of all the write amplifiers of the main amplifier MA0 are under the high impedance state.

On the other hand, the preamplifiers PA0L and PA0R of the main amplifier MA0 each include a cascade circuit containing bipolar transistors T1 and T2 as the basic structure. The bases of these transistors T1 and T2 are connected commonly and a predetermined reference potential Vg2 is supplied to them. The emitters of the transistors T1 and T2 are the input terminal of each preamplifier and connected to the corresponding read complementary common data lines $\overline{RIO0L}$ and $\overline{RIO0R}$, respectively.

Accordingly, each cascade circuit containing the transistors T1 and T2 functions as a current sense type amplification circuit for the corresponding read complementary common data lines $\overline{RIO0L}$ and $\overline{RIO0R}$. At this time the center value of the signal level of the read complementary common data lines $\overline{RIO0L}$ and $\overline{RIO0R}$ is the difference obtained by subtracting the base-emitter voltage of the transistor T1, T2 from the reference potential Vg1 described above. The current change of the read complementary common data line $\overline{RIO0L}$ or $\overline{RIO0R}$ or the gate voltage of the amplification MOSFETs Q27 and Q28 of the above-mentioned column switch or in other words, the read signal voltage in accordance with the binary read signal of the selected complementary data line of the memory array AMRY0, can be obtained from the collectors of the transistors T1 and T2. In this embodiment, the read signal voltage obtained by the cascade circuit is designed so as to have the minimum necessary signal amplitude by setting suitably the values of the load resistance disposed on the collector side of the transistors T1 and T2. These read signal voltages are supplied to the two input terminals of the read amplifier RA0 through an output emitter follower circuit consisting of transistors T3 and T4.

Though not particularly limitative, the read amplifier RA0 of the main amplifier MA0 includes two sets of differential transistors T7, T8 and T5, T6. The bases of the differential transistors T7, T8 are one of the input terminals of the read amplifier RA0 and the output signal of the preamplifier PA0L is supplied thereto. Similarly, the bases of the differential transistors T5, T6 are the other input terminal of the read amplifier RA0 and the output signal of the preamplifier PA0R is supplied thereto. N-channel MOSFETs Q15 through Q17 in the series form are disposed between the commonly connected emitters of the differential transistors T7, T8 and the ground potential of the circuit. Similarly, N-channel MOSFETs Q18 through Q20 in the series form are disposed between the commonly connected emitters of the differential transistors T5, T6 and the ground potential of the circuit. Among them, the timing signal φra from the timing generation circuit TG is supplied to the gates of MOSFETs Q15 and Q18. When the dynamic type RAM is in the read mode and under the selection state, this timing signal φra is set temporarily to the high level at a predetermined timing. The inversion internal address signal $\overline{axi}$ described above is supplied to the gate of MOSFET Q16 and the non-inversion internal address signal axi is supplied to the gate of MOSFET Q19. When a predetermined reference potential Vg1 is supplied to the gate of MOSFETs Q17 and Q20, they function as a constant current source.

The collector of the transistor T7 is connected commonly to the collector of the transistor T5 and further to the base of a transistor T9 constituting an output emitter follower circuit. A load resistor and a level clamp diode are disposed between the commonly connected collectors of the transistors T7, T5 and the power source voltage Vcc of the circuit. After subjected to the level shift by the diode, the emitter voltage of the transistor T9 becomes the inversion output signal $\overline{moO}$ of the main amplifier MA0. The inversion output signal $\overline{moO}$ of the main amplifier MA0 is supplied to-the later-appearing data input/output circuit I/O and fed back to the commonly connected collectors of the transistors T7, T5 through a feedback amplification circuit consisting of N-channel MOSFETs Q12 and Q14. Accordingly, the transistor T9 and the feedback amplification circuit described above function as an output latch.

Similarly, the collector of the transistor T8 is connected commonly to the collector of the transistor T6 and further to the base of the transistor T10 constituting an output emitter follower circuit. A load resistor and a level clamp diode are disposed between the commonly connected collectors of the transistors T8, T6 and the power source voltage Vcc of the circuit. After level-shifted by the diode, the emitter voltage of the transistor T10 becomes the non-inversion output signal moO of the main amplifier MA0. The non-inversion output signal moO of the main amplifier MA0 is supplied to the later-appearing data input/output circuit I/O and fed back to the commonly connected collectors of the transistors T8, T6 through a feedback amplification circuit consisting of N-channel MOSFETs Q11 and Q13. Accordingly, the transistor and the feedback amplification circuit function as the output latch.

The differential transistors T7, T8 are brought selectively into the operative state when the timing signal φra is at the high level and at the same time, when the inversion internal address signal $\overline{axi}$ is at the high level. Therefore, the output signal of the preamplifier PA0L is further amplified by the read amplifier RA0 and transmitted as the complementary output signals $\overline{moO}\cdot\overline{moO}$ to the data input/output circuit I/O. On the other hand, when the timing signal φra is at the high level and at the same time, when the non-inversion internal address signal axi is at the high level, the differential transistors T5, T6 are instead brought selectively into the operative state. Accordingly, the output signal of the preamplifier PA0R is further amplified by the read amplifier RA0 and is transmitted as the complementary output signals moO• $\overline{moO}$ to the data input/output circuit I/O.

Though not particularly limitative, the data input/output circuit I/O includes a data input circuit and a data output circuit. It also includes an output selection circuit for transmitting selectively the complementary output signals moO supplied from the main amplifier MA0 (herein, the non-inversion output signal moO and the inversion output signal $\overline{moO}$ will be expressed as the "complementary output signals moO, and so forth) and the complementary output signals mo1 supplied from the main amplifier MA1. The timing signal φoe is supplied from the timing generation circuit TG to the data output circuit and the uppermost bit complementary internal address signal ayj is supplied from the row address buffer RAB to the output selection circuit. When the dynamic type RAM is in the read mode and under the selection state, the timing signal φoe is temporarily set to the high level at a predetermined timing.

When the dynamic type RAM is in the write mode, the data input circuit of the data input/output circuit I/O converts the write data of the ECL level or the TTL level supplied through the data input/output terminal DIO to the write signal of the MOS level. These write signals are supplied commonly to the write amplifiers of the main amplifiers MA0 and MA1 as the output signals wm described above.

On the other hand, the output selection circuit of the data input/output circuit I/O transmits selectively the complementary output signals lines $\overline{mo0}$ and $\underline{mo}1$ supplied from the read amplifiers of the main amplifiers MA0 and MA1 to the data output circuit in accordance with the complementary internal address signal ayj. In other words, when the complementary internal address signal ayj is a logic "0", the output selection circuit selects the complementary output signal moO supplied from the main amplifier MA0. It selects the complementary output signal mo1 supplied from the main amplifier MA1 when the complementary internal address signal ayj is a logic "1", and transmits it to the data output circuit.

When the timing signal φoe described above is at the high level, the data output circuit of the data input/output circuit I/O is brought selectively into the operative state. Under this operative state, the data output circuit sends out the read signal outputted through the output selection circuit from the data input/output terminal DIO. When the timing signal φoe is at the low level, the output of the data output circuit is under the high impedance state.

The timing generation circuit TG generates various kinds of timing signals described above on the basis of the chip enable signal $\overline{CE}$, the write enable signal $\overline{WE}$, the output enable signal $\overline{OE}$ and the refresh control signal $\overline{RF}$ supplied as the control signals from the outside and then to each circuit of the dynamic type RAM.

As described above, the write complementary common data line and read complementary common data line are disposed separately from one another in the dynamic type RAM of this embodiment. Among them, the write complementary common data line is directly connected to each complementary data line of the memory array through the switch MOSFET that is turned ON selectively in accordance with the column address signal in the same way as in the conventional dynamic type RAM. The read complementary common data line is indirectly connected to each complementary data line of the memory array through the switch MOSFET which is disposed in series between the read complementary common data line and the ground potential and is selectively turned ON in accordance with the column address signal and through the amplification MOSFET whose gate is connected to the corresponding complementary data line of the memory array. Furthermore, the signal amplitude of the write complementary common data line is fully swung but since the read complementary common data line is connected to the current sense type amplification circuit disposed in the corresponding main amplifier, its signal amplitude is limited to the minimum necessary value. Therefore, in the dynamic type RAM of this embodiment, the read operation is sped up, the driving capacity required for the unit amplification circuit of the sense amplifier may be small and the power consumption necessary for the read operation can be reduced.

As illustrated in the foregoing embodiments, the present invention provides the following effects when applied to a semiconductor memory device such as the dynamic type RAM.

(1) The write common data line and the read common data line are disposed separately from one another in the semiconductor memory device such as the dynamic type RAM, the read common data line is indirectly connected to each data line of the memory array through the switch MOSFET which is disposed in series between the read common data line and the ground potential of the circuit and is selectively turned ON and through the amplification MOSFET whose gate is connected to the corresponding data line of the memory array, and its signal amplitude is limited to the minimum necessary value. In this manner, the charge/discharge time of the read common data line is reduced and the read operation of the dynamic type RAM can be sped up.

(2) Due to the effect described in item (1) given above, the driving capacity required for the unit amplification circuit of the sense amplifier disposed so as to correspond to each data line can be reduced and its necessary layout area can be reduced.

(3) Due to the effects (1) and (2) described above, consumed power of the read operation of the dynamic type RAM can be reduced.

Although the present invention has thus been described definitely with reference to the embodiments thereof, the present invention is not particularly limited thereto but can of course be changed or modified in various manners. For example, in FIG. 9, the ground potential of the circuit may be supplied selectively to the amplification MOSFETs Q27, Q28 of the column switch CS0 when the dynamic type RAM is brought selectively into the selection state in the read mode. The switch MOSFETs Q29 and Q30 may be disposed on the ground potential side of the amplification MOSFETs Q27 and Q28. In this case, the number of the switch MOSFET can be made to one by connecting commonly the sources of the amplification MOSFETs Q27 and Q28. In FIG. 10, the preamplifiers PA0L and PA0R of the main amplifier need not particularly be the cascade circuit. The combination of the write complementary common data line, the read complementary common data line and the main amplifiers MA0, MA1 is not limited by this embodiment. In FIG. 11, the dynamic type RAM may have four or more sets of memory arrays and may further employ the address multiplex system. Various forms may be employed for the memory array and its peripheral circuit shown in FIGS. 9 and 10, the definite circuit construction of the main amplifier, the block construction of the dynamic type RAM shown in FIG. 11, the combination of the control signals and the address signals, and so forth.

Although the description given above deals primarily with the application of the present invention to the dynamic type RAM having the pseudo-static type RAM form as the background and field of utilization of the present invention, the present invention is not particularly limited thereto. For example, the present invention can be applied also to ordinary dynamic type RAMs, other various semiconductor memory devices and microcomputers with a built-in memory. The present invention can be applied widely to the semiconductor memory devices having at least common data lines and digital apparatus with built-in semiconductor memory devices of such a type.

What is claimed is:

1. A semiconductor memory comprising:

a plurality of data lines arranged in parallel;

a plurality of sense amplifiers coupled to said data lines;

a main word line which is selected in a refresh operation and in a normal operation;

a plurality of sub-word lines arranged on a straight line parallel to said main word line;

a plurality of single-MOSFET type dynamic memory cells, each of which is arranged, with respect to a plan view of said plurality of data lines, to correspond to an intersection of one of said data lines and one of said sub-word lines;

a plurality of gate circuits, each of which is coupled to said main word line and a corresponding sub-word line; and a plurality of selecting lines, each of which is coupled to a corresponding gate circuit, wherein said plurality of sub-word lines are selected simultaneously on the basis of a refresh address in said refresh operation, and wherein a part of said plurality of sub-word lines is selected on the basis of a read or a write address in said normal operation.

2. A semiconductor memory according to claim 1, wherein said selecting lines are arranged in parallel to said plurality of data lines.

3. A semiconductor memory according to claim 2, wherein one or more of said plurality of selecting lines are controllably supplied with a selection level on the basis of Y system address signals.

4. A semiconductor memory according to claim 3, wherein the operation state of said plurality of sense amplifiers are controlled on the basis of signals for selecting said sub-word lines.

5. A semiconductor memory according to claim 1, wherein each data line corresponds to a pair of complementary bit lines, and wherein each of said sense amplifiers is associated with a separate pair of complementary bit lines.

6. A semiconductor memory according to claim 1, wherein said memory is provided on a single chip.

7. A semiconductor memory comprising:

a plurality of data lines arranged in parallel;

a plurality of sense amplifiers coupled to said data lines;

a main word line which is selected in a refresh operation and in a normal operation;

a plurality of sub-word lines arranged on a straight line parallel to said main word line; and a plurality of single-MOSFET type dynamic memory cells, each of which is arranged, with respect to a plan view of said plurality of data lines, to correspond to an intersection of one of said data lines and one of said sub-word lines, wherein said plurality of sub-word lines are selected simultaneously on the basis of a refresh address in said refresh operation, wherein a part of said plurality of sub-word lines is selected on the basis of a read or a write address in said normal operation, and wherein the operation state of said plurality of sense amplifiers are controlled on the basis of signals for selecting said sub-word lines.

8. A semiconductor memory according to claim 7, further comprising:

a plurality of gate circuits, each of which has an input terminal connected to said main word line and an output terminal connected to a sub-word line; and a plurality of selecting lines, each of which is coupled to apply a selection signal to a corresponding gate circuit.

9. A semiconductor memory according to claim 8, wherein said memory is provided on a single chip.

10. A semiconductor memory comprising:

a plurality of data lines arranged in parallel;

a plurality of sense amplifiers coupled to said data lines;

a main word line which is selected in a refresh operation and in a normal operation;

a plurality of sub-word lines arranged on a straight line parallel to said main word line; and a plurality of single-MOSFET type dynamic memory cells, each of which is arranged respect to a plan view of said plurality of data lines, to correspond to an intersection of one of said data lines and one of said sub-word lines, wherein selection of a part of said plurality of sub-word lines is made in said normal operation in which said main word line is controllably electrically connected to that one of said sub-word lines which is coupled to a memory cell selected for reading, on the basis of a read address, or writing, on the basis of a write address, and wherein said plurality of sub-word lines are selected simultaneously on the basis of a refresh address in said refresh operation in which said main word line is controllably electrically connected to all of said sub-word lines.

11. A semiconductor memory according to claim 10, wherein each sub-word line is associated with a respective group of data lines corresponding to a sub-multiple of said plurality of data lines.

12. A semiconductor memory according to claim 10, further comprising:

a plurality of gate circuits, each of which has an input terminal connected to said main word line and an output terminal connected to a sub-word line; and a plurality of selecting lines, each of which is coupled to apply a selection signal to a corresponding gate circuit.

13. A semiconductor memory according to claim 12, wherein said memory is provided on a single chip.

14. A semiconductor memory comprising:

a plurality of data lines arranged in parallel;

a plurality of sense amplifiers coupled to said data lines;

a main word line which is selected in a refresh operation and in a normal operation;

a plurality of sub-word lines arranged on a straight line parallel to said main word line; and a plurality of single-MOSFET type dynamic memory cells, each of which is arranged, with respect to a plan view of said plurality of data lines, to correspond to an intersection of one of said data lines and one of said sub-word lines, wherein each sub-word line is associated with a respective group of data lines corresponding to a sub-multiple of said plurality of data lines and one of said sub-word, wherein each data line is coupled to a corresponding switching circuit which is selectively gated ON on the basis of Y system address signals, wherein said plurality of sub-word lines are selected simultaneously on the basis of a refresh address in said refresh operation, and wherein selection of a part of said plurality of sub-word lines is made on the basis of a read or a write address in said normal operation such that an electrical connection of a sub-word line to said main word line is made on the basis of selection of a data line associated with that sub-word line by getting ON a corresponding switching circuit on the basis of the Y system address signals.

15. A semiconductor memory according to claim 14, further comprising:

a plurality of gate circuits, each of which is coupled to said main word line and corresponding sub-word line, and is responsive to a selection signal in accordance with a selection being made of a data line associated with the same group of data lines.

16. A semiconductor memory according to claim 15, wherein said single-MOSFET type dynamic memory cells include a MOSFET switch in series with a storage capacitor, respectively, and wherein each said gate circuit is a MOSFET switch.

17. A semiconductor memory according to claim 16, wherein each data line corresponds to a pair of complementary bit lines, and wherein each of said sense amplifiers is associated with a separate pair of complementary bit lines.

18. A semiconductor memory according to claim 14, further comprising:

a plurality of gate circuits, each of which has an input terminal connected to said main word line and an output terminal connected to a sub-word line; and a plurality of selecting lines, each of which is coupled to apply a selection signal to a gate circuit coupled to a sub-word line associated with the selected data line.

19. A semiconductor memory according to claim 18, wherein said memory is provided on a single chip.

20. A semiconductor memory device comprising:

a plurality of data lines arranged in parallel along a first direction;

a plurality of word lines arranged in parallel along a second, perpendicular direction and intersecting, with respect to a plan view of a main surface of said device, said data lines, wherein each word line includes a main word line and a plurality of sub-word lines arranged at regular intervals, respectively, on a straight line parallel to said main word line;

a plurality of sense amplifiers coupled to said data lines, respectively;

a plurality of single-MOSFET type dynamic memory cells, each of which is arranged to correspond to an intersection of one of said data lines and one of said sub-word lines;

a plurality of gate circuits, each of which is coupled to a respective said main word line and a sub-word line corresponding thereto; and a plurality of selecting lines, each of which is coupled to a gate circuit coupled to each of said main word lines, wherein said main word line is selected in a refresh operation and in a normal operation, wherein said plurality of sub-word lines are selected simultaneously on the basis of a refresh address in said refresh operation, and wherein a part of said plurality of sub-word lines is selected on the basis of a read or a write address in said normal operation.

21. A semiconductor memory device according to claim 20, wherein a main word line, when selected by X system address signals, is controllably connected, via one of said gate circuits, to that one of said plurality of sub-word lines associated therewith which is coupled to a memory cell selected for reading or writing, in said normal operation, and said main word line is controllably connected, via separate gate circuits, to all of the sub-word lines corresponding thereto in said refresh operation.

22. A semiconductor memory device according to claim 21, wherein each sub-word line is associated with a respective group of data lines corresponding to a sub-multiple of said plurality of data lines.

23. A semiconductor memory device according to claim 22, wherein each selection line is commonly coupled to gate circuits coupled to sub-word lines associated with the same group of data lines.

24. A semiconductor memory device according to claim 23, wherein said memory device is a single chip device.

25. A semiconductor memory device according to claim 21, wherein individual ones of each said plurality of sub-word lines are commonly arranged at regular intervals to form individual word blocks, each word block including a group of sub-word lines, corresponding to said plurality of main word lines, respectively, and a group of data lines, corresponding to a sub-multiple of said plurality of data lines.

26. A semiconductor memory device according to claim 25, wherein each data line is coupled to a corresponding switching circuit which is selectively gated ON on the basis of Y system address signals, and wherein connection of a sub-word line to said main word line, in said normal operation, is made on the basis of selection of a data line associated therewith by gating ON a corresponding switching circuit on the basis of the Y system address signals.

27. A semiconductor memory device according to claim 26, wherein each gate circuit is responsive to a block selection signal in accordance with a selection being made of a data line associated with the same group of data lines in said word block.

28. A semiconductor memory device according to claim 24, wherein said single-MOSFET type dynamic memory cells include a MOSFET switch in series with a storage capacitor, respectively, and wherein each said gate circuit is a MOSFET switch.

29. A semiconductor memory device according to claim 28, wherein each data line corresponds to a pair of complementary bit lines, and wherein each of said sense amplifiers is associated with a separate pair of complementary bit lines.

30. A semiconductor memory device according to claim 27, wherein each selecting line is commonly coupled to gate circuits which are coupled to sub-word lines associated with the same word block.

31. A semiconductor memory device according to claim 30, wherein said memory device is a single chip device.

32. A semiconductor memory device according to claim 20, wherein said single-MOSFET type dynamic memory cells include a MOSFET switch in series with a storage capacitor, respectively, wherein each said gate circuit is a MOSFET switch, wherein each data line corresponds to a pair of complementary bit lines, and wherein each of said sense amplifiers is associated with a separate pair of complementary bit lines.

33. A semiconductor memory device according to claim 20, wherein said memory device is a single chip device.

34. A semiconductor memory comprising:

a plurality of data lines;

a plurality of main word lines;

individual groupings of plural sub-word lines, each grouping of plural sub-word lines corresponding to a respective one of said main word lines and being arranged on a straight line which is parallel to the corresponding main word line;

a plurality of single-MOSFET type dynamic memory cells, each of which is arranged to correspond to an intersection of one of said data lines and one of said sub-word lines;

a plurality of gate circuits, each of which has an input terminal connected to a main word line and an output terminal connected to a sub-word line of a corresponding grouping of plural sub-word lines; and a plurality of selecting lines, each of which is coupled to a gate circuit coupled to each of said main word lines, wherein at least one of said plurality of sub-word lines, corresponding to a main word line, is selected on the basis of a read or a write address in a normal operation, and wherein the number of sub-word lines selected simultaneously on the basis of a refresh address in a refresh operation is greater than the number selected in said normal operation.

35. A semiconductor memory according to claim 34, further comprising:

a plurality of sense amplifiers coupled to said data lines, respectively, wherein the operation state of said plurality of sense amplifiers are controlled on the basis of signals for selecting said sub-word lines.

36. A semiconductor memory according to claim 34, wherein said memory is provided on a single chip.

37. A semiconductor memory according to claim 34, wherein each selecting line is commonly coupled to gate circuits which couple different ones of similarly positioned sub-word lines to corresponding ones of said main word lines, respectively.

* * * * *